(12) United States Patent
Halilov et al.

(10) Patent No.: US 7,517,702 B2
(45) Date of Patent: Apr. 14, 2009

(54) METHOD FOR MAKING AN ELECTRONIC DEVICE INCLUDING A POLED SUPERLATTICE HAVING A NET ELECTRICAL DIPOLE MOMENT

(75) Inventors: Samed Halilov, Waltham, MA (US); Xiangyang Huang, Waltham, MA (US); Ilija Dukovski, Newtonville, MA (US); Jean Augustin Chan Sow Fook Yiptong, Worchester, MA (US); Robert J. Mears, Wellesley, MA (US); Marek Hytha, Brookline, MA (US); Robert John Stephenson, Newton Upper Falls, MA (US)

(73) Assignee: MEARS Technologies, Inc., Waltham, MA (US)

( * ) Notice: Subject to any disclaimer, the term of this patent is extended or adjusted under 35 U.S.C. 154(b) by 298 days.

(21) Appl. No.: 11/614,513

(22) Filed: Dec. 21, 2006

(65) Prior Publication Data

US 2007/0161138 A1 Jul. 12, 2007

Related U.S. Application Data

(60) Provisional application No. 60/753,141, filed on Dec. 22, 2005, provisional application No. 60/753,143, filed on Dec. 22, 2005, provisional application No. 60/752,990, filed on Dec. 22, 2005, provisional application No. 60/753,120, filed on Dec. 22, 2005, provisional application No. 60/753,142, filed on Dec. 22, 2005, provisional application No. 60/752,985, filed on Dec. 22, 2005, provisional application No. 60/752,984, filed on Dec. 22, 2005.

(51) Int. Cl.
*H01L 21/00* (2006.01)

(52) U.S. Cl. ............ 438/3; 257/E21.208; 257/E21.436; 257/E21.663

(58) Field of Classification Search ............... 438/3; 257/E21.208, E21.436, E21.663
See application file for complete search history.

(56) References Cited

U.S. PATENT DOCUMENTS 4,485,128 A 11/1984 Dalal et al. ................. 427/85

(Continued)

FOREIGN PATENT DOCUMENTS

EP 0 843 361 5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Trung Dang
(74) *Attorney, Agent, or Firm*—Allen, Dyer, Doppelt, Milbrath & Gilchrist, P.A.

(57) ABSTRACT

A method for making an electronic device may include forming a poled superlattice comprising a plurality of stacked groups of layers and having a net electrical dipole moment. Each group of layers of the poled superlattice may include a plurality of stacked semiconductor monolayers defining a base semiconductor portion and at least one non-semiconductor monolayer thereon. The at least one non-semiconductor monolayer may be constrained within a crystal lattice of adjacent base semiconductor portions, and at least some semiconductor atoms from opposing base semiconductor portions may be chemically bound together through the at least one non-semiconductor monolayer therebetween. The method may further include coupling at least one electrode to the poled superlattice.

27 Claims, 18 Drawing Sheets

U.S. PATENT DOCUMENTS

| | | | |
|---|---|---|---|
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Shimizu et al. | 438/786 |
| 6,566,679 B2 | 5/2003 | Nikonov et al. | 257/29 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 7,153,763 B2 * | 12/2006 | Hytha et al. | 438/604 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |
| 2005/0268848 A1 * | 12/2005 | Wang | 118/719 |
| 2005/0282330 A1 * | 12/2005 | Mears et al. | 438/222 |
| 2006/0263980 A1 * | 11/2006 | Kreps et al. | 438/257 |
| 2007/0166928 A1 * | 7/2007 | Halilov et al. | 438/285 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors ($n>2.0$) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

* cited by examiner

METHOD FOR MAKING AN ELECTRONIC DEVICE INCLUDING A POLED SUPERLATTICE HAVING A NET ELECTRICAL DIPOLE MOMENT

CROSS-REFERENCE TO RELATED APPLICATIONS

The present applications claims the benefit of U.S. Provisional Application Nos. 60/753,141, 60/753,143, 60/752,990, 60/753,120, 60/753,142, 60/752,985, and 60/752,984, all filed Dec. 22, 2005, all of which are hereby incorporated herein in their entireties by reference.

FIELD OF THE INVENTION

The present invention relates to the field of semiconductors, and, more particularly, to semiconductor devices comprising superlattices and associated methods.

BACKGROUND OF THE INVENTION

Piezoelectric materials are used in numerous devices where a conversion of mechanical energy into electrical energy or vice-versa is required. More particularly, in piezoelectric materials induced charges are proportional to mechanical stress. Piezoelectric materials also conversely have a geometric strain that is proportional to an applied electric field. This phenomenon is based upon the dependence of the polarization (i.e., surface charge) of the material to changes in strain and vice versa.

Lead zirconium titanate (PZT) ceramics are one example high-performance piezoelectric materials. However, PZT ceramics have fallen out of favor in many commercial applications and materials due to concerns over its toxicity (i.e., because they include lead). Certain quantities which are desirable in a piezoelectric material for devices such as pressure sensors, accelerators, and gyroscopes, are as follows:

a) high piezoelectric strain tensor d, which determines the magnitude of the induced strain n as a function of an applied electric field E, $\eta = dE$ ;

b) high piezoelectric voltage tensor g, which determines the magnitude of the induced electric field as a function of an external stress strain $\sigma$, $E = g\sigma$;

c) high electromechanical coupling factor k, which describes the conversion rate between applied electrical energy and stored mechanical energy, or equivalently, the conversion rate between stored electrical energy and input mechanical $k = d/\sqrt{\in S}$, where $\in$ stands for dielectric tensor and S stands for the compliance tensor of the material energy;

d) high energy transmission coefficient $\lambda = [1/k - \sqrt{(1/k)^2 - 1}]^2$; and e) low static dielectric constant $\in$.

Piezoelectric sensors and vibratory gyroscopes are devices that use piezoelectric crystals to convert mechanical strain caused by external stress of either pressure or acceleration into electrical voltage. Examples of current piezoelectric materials used for these purposes and their figures of merit are provided in Table 1:

TABLE 1

|  | d33, pC/N | G33, 10-3 Vm/N | k | Qm | T_C, °C. |
|---|---|---|---|---|---|
| Quartz | 12.3 | 57.8 | 0.1 | >100000 | — |
| PZT | 289 | 26.1 | 0.58 | 500 | 328 |
| (K,Na)NbO₃—LiTaO₃ | 400 | 29.9 | 0.61 | — | 253 |
| PVDF-TrFE | 33 | 380 | — | <10 | — |

Another application in which piezoelectric materials are utilized is surface acoustic wave (SAW) devices. SAW devices are used in numerous devices including intermediate frequency (IF) filters (e.g., for cellular phones, remote control devices, ISM band devices, WLAN devices, satellite TV, cable modems etc.), Community Antenna Television (CATV) and Video Cassette Recorder (VCR) components, synthesizers, analyzers and navigation devices, for example. In addition to some of the quantities noted above, some additional quantities that are desirable in a piezoelectric material for use in SAW devices are:

a) high electromechanical coupling factor k, which describes the conversion rate between applied electrical energy and stored mechanical energy, or equivalently, the conversion rate between stored electrical energy and input mechanical energy, $k = d/\sqrt{\in S}$, where $\in$ stands for dielectric tensor and S stands for compliance tensor of the material;

b) high surface wave coupling factor $k^2 = 2(v_f - v_m)/v_f$, which indicates the maximum bandwidth obtainable and the amount of signal loss between input and output and determines the fractional bandwidth as a function of minimum insertion loss for a given material and filter; and c) low temperature coefficient of delay (TCD), which is an indication of the frequency shift expected for a transducer due to a temperature change and is also a function of cut angle and propagation direction.

Another use for piezoelectric materials is in transformers and other devices such as vibrators, ultrasonic transducers, and wave frequency filters. More particularly, piezoelectric materials may be used in low-power piezo-transformers to backlight LCD displays, as well as high-power transformers such as for battery chargers, power management devices in computers, high-intensity discharge headlights for cars, etc. Certain quantities which are desirable in piezoelectric materials for use in such applications are as follows:

a) high electromechanical coupling factor k, which indicates the conversion rate between applied electrical energy and stored mechanical energy, or equivalently, the conversion rate between stored electrical energy and input mechanical energy, $k^2 = $ (stored mechanical energy/input electrical energy)=(stored electrical energy/input mechanical energy). Generally speaking, the coupling factor is determined by the piezoelectric strain constant d, elastic compliance tensor S (inverted elastic tensor), and dielectric constant (at zero stress) $\in_\sigma$ of the material. These quantities determine the induced strain $\eta$ and electric displacement D in the piezoelectric material as a function of an applied electric field E and stress $\sigma$ through the following equations:

$\eta = dE + S\sigma$, and $D = d\sigma + \in^\sigma E;$ b) high mechanical quality factor Q_m, which indicates the quality of the material as a frequency resonator and is determined by the quality of crystalline structure. Most of the existing materials used in the industry typically have a quality factor of less than about 500. Quartz is one example of a piezoelectric material with a high Q_m, however it has a very low electromechanical coupling factor k; and c) high voltage rise ratio r (step-up ratio) is given for the unloaded condition by $$r=(4/\pi^2)k_{32}k_{33}Q_m[L(\text{output})/\text{thickness}][2\sqrt{S_{33}^E S_{22}^E}/(1+\sqrt{S_{33}^D/S_{22}^E})]$$

which is due to high electromechanical coupling constants k__32, k__33 and high mechanical factor Q_m (i.e., quality of crystal).

Another similar type of material is pyroelectrics. Pyroelectric materials are used in temperature sensors and thermal imaging devices (e.g., vidicon sensors). The property of pyroelectric materials utilized in such devices may be described as the pyroelectric effect, which implies a current or voltage response of the material to a temperature change, either by continuous heating or by the absorption of sinusoidally modulated radiation. The physical mechanism of this phenomenon is based upon the dependence of the polarization (i.e., surface charges) of the material to a change in temperature. This means that the pyroelectric material has to provide spontaneous polarization, or briefly be polar in the temperature range of interest. Accordingly, there is a need for piezoelectric and pyroelectric materials than can provide desired properties such as those discussed above, yet do not have the drawbacks associated with traditional materials such as toxicity, for example.

Another useful class of materials are ferroelectric materials. Ferroelectrics find particular application in non-volatile memories by taking advantage of two polarization states of the material that can be interchanged upon application of an external electric field. When a ferroelectric thin film with a large polarization electric field hysteresis is used to change the surface potential of the channel between the source and drain in a Metal Ferroelectric Semiconductor Field Effect Transistor (MFSFET), for example, a non-volatile memory is achieved. This is the case if (1) the two polarization states are stable without needing to be refreshed by an external power source, and (2) switching between these two polarization states causes a different potential on the surface of the channel, leading to a change in the amount of carriers and thus current (i.e., the drain current exhibits two states, on and off, depending on the ferroelectric surface potential on the gate).

State-of-the-art use of ferroelectric materials as a non-volatile memory element implies a use of two polarization states of the material which can be interchanged upon application of an external electric field. When a ferroelectric thin film with a large polarization electric field hysteresis is used as a memory capacitor in a circuit-latch structure which includes a Metal Oxide Semiconductor Field Effect Transistor (MOSFET), a non-volatile memory is achieved, since the two polarization states are stable without a need to be refreshed by an external power source.

One problem with reading from a Ferroelectric Random Access Memory (FeRAM) is that the polarization hysteresis characteristic degrades with increasing cycles of the reading process. The degradation is a result of a large voltage applied on the ferroelectric film at every reading event. The fatigue is related to the generation of oxygen vacancies and the diffusion of ions in traditional ferroelectric materials. Such materials include PZT [Pb(ZrTi)O$_3$] perovskite, and Y1 ($BiSr_2Ta_2O_9$) alloy ferroelectric compositions. While the latter provides somewhat better anti-fatigue properties, these alloys require relatively complicated fabrication processes.

Many large scale integrated semiconductor memories use ferroelectric films. Based in part on the reasons noted above, there is an interest in new advanced polarizable materials. Since the conventional Si micromachining technology coupled with silicon oxide or nitride and metal is limited in its ability to produce fine-scale capacitors, utilization of ferroelectrics with polarization hysteresis has gained attention in non-volatile memory technology development.

One requirement of a MFSRAM is the presence of two stable minima for the electric polarization state, which can be interchanged upon application of an external electric field. Since each write operation in the MFSRAM reverses the polarization, and the effective gate voltage changes due to the change in polarization, the ferromagnetic material itself needs to be structurally stable to withstand the repetitive polarization reversal. Existing ferroelectric materials used in non-volatile memories typically have a lifespan that is related to their Curie temperature, i.e., the temperature at which the material undergoes a phase transition from a ferroelectric to a paraelectric state (i.e., a state with no spontaneous polarization).

Some of the leading materials used in non-volatile memory devices are PZT-based films, which have a Curie temperature of around 450° C. Another material, SBT (Bi-based layered structure), has a comparable Curie temperature of around 310° C. and provides slightly better performance against the destructive effect of polarization reversal.

SUMMARY OF THE INVENTION

In view of the foregoing background, it is therefore an object of the present invention to provide a method for making an electronic device having desired piezoelectric and/or pyroelectric properties and related methods.

This and other objects, features, and advantages are provided by a method for making an electronic device which may include forming a poled superlattice comprising a plurality of stacked groups of layers and having a net electrical dipole moment. More particularly, each group of layers of the poled superlattice may include a plurality of stacked semiconductor monolayers defining a base semiconductor portion and at least one non-semiconductor monolayer thereon. Further, the at least one non-semiconductor monolayer may be constrained within a crystal lattice of adjacent base semiconductor portions, and at least some semiconductor atoms from opposing base semiconductor portions may be chemically bound together through the at least one non-semiconductor monolayer therebetween. The method may further include coupling at least one electrode to the poled superlattice.

More particularly, the poled superlattice may generate an electrical potential on the at least one electrode based upon a mechanical stress imparted on the poled superlattice. Furthermore, the method may include positioning at least one mass adjacent the poled superlattice to impart the mechanical stress thereto based upon movement of the at least one mass. The poled superlattice may also generate an electrical potential on the at least one electrode based upon thermal energy imparted to the poled superlattice. Moreover, a thermal source may be provided for causing the poled superlattice to generate an electrical potential on the at least one electrode based upon thermal energy from the thermal source.

By way of example, the thermal source may be a cathode. Also, at least one anode may be positioned adjacent the cathode. In addition, a semiconductor lens may also be positioned adjacent the poled superlattice on a side thereof opposite the cathode.

Furthermore, the at least one electrode may include an input electrode coupled to a first portion of the poled superlattice for inducing a surface acoustic wave thereon, and an output electrode coupled to a portion of the poled superlattice. Also, the input and output electrodes may be interdigitated electrodes, for example.

In addition, the at least one electrode may include a low voltage electrode and a high voltage electrode coupled to the poled superlattice, and the poled superlattice may transform voltage levels between the low and high voltages. Additionally, the poled superlattice may be mechanically deformable based upon an electrical potential on the at least one electrode. As such, a backing layer and a matching layer may be formed on respective opposing sides of the poled superlattice so that the poled superlattice generates an acoustic signal based upon an electrical potential on the at least one electrode. Furthermore, the poled superlattice may generate thermal energy based upon an electrical potential on the at least one electrode.

Forming the poled superlattice may include exposing the superlattice to an electrical field to impart the net electrical dipole moment therein. Each base semiconductor portion may comprise a base semiconductor selected from the group consisting of Group IV semiconductors, Group III-V semiconductors, and Group II-VI semiconductors, such as silicon, for example. Moreover, each non-semiconductor monolayer may comprise a non-semiconductor selected from the group consisting of oxygen, nitrogen, fluorine, and carbon-oxygen.

DETAILED DESCRIPTION OF THE PREFERRED EMBODIMENTS

Figure 1:
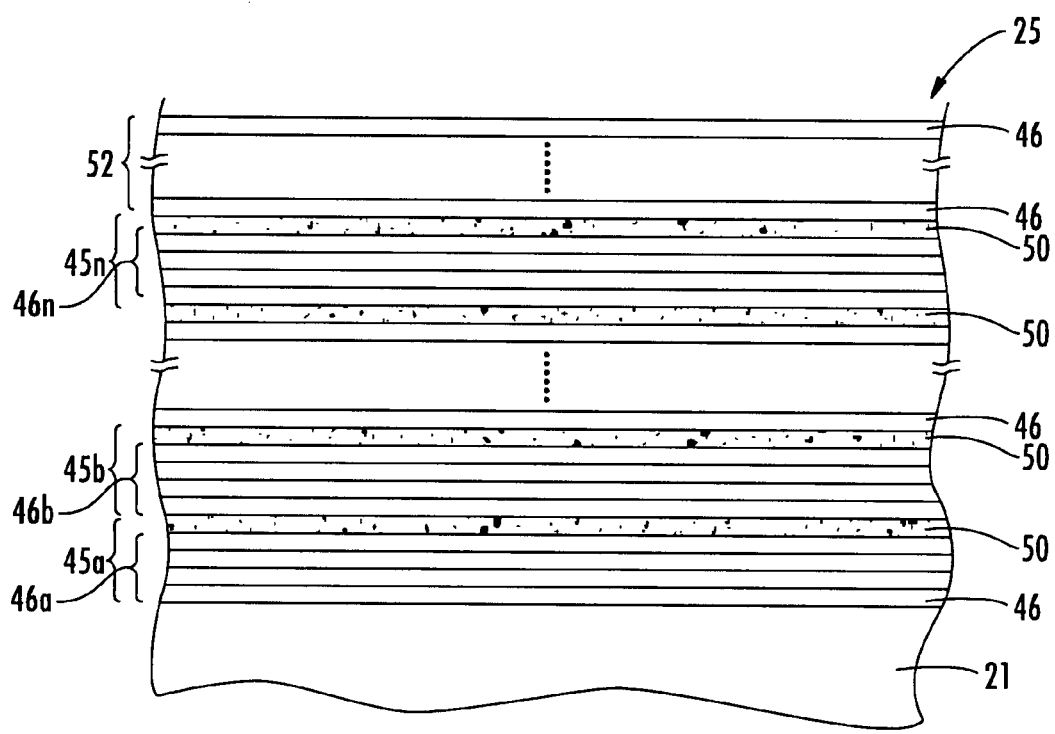
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3 k}{\sum_{E>E_F} \int_{B.Z.} f(E(k, n)E_F, T) d^3 k}$$

for electrons and:

$$M_{h,i,j}^{-1}(E_F, T) =$$

$$-\frac{\sum_{E<E_F} \int_{B.Z.} (\nabla_k E(k, n))_i (\nabla_k E(k, n))_j \frac{\partial f(E(k, n), E_F, T)}{\partial E} d^3 k}{\sum_{E<E_F} \int_{B.Z.} (1 - f(E(k, n)E_F, T)) d^3 k}$$

for holes, where f is the Fermi-Dirac distribution, $E_F$ is the Fermi energy, T is the temperature, E(k, n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
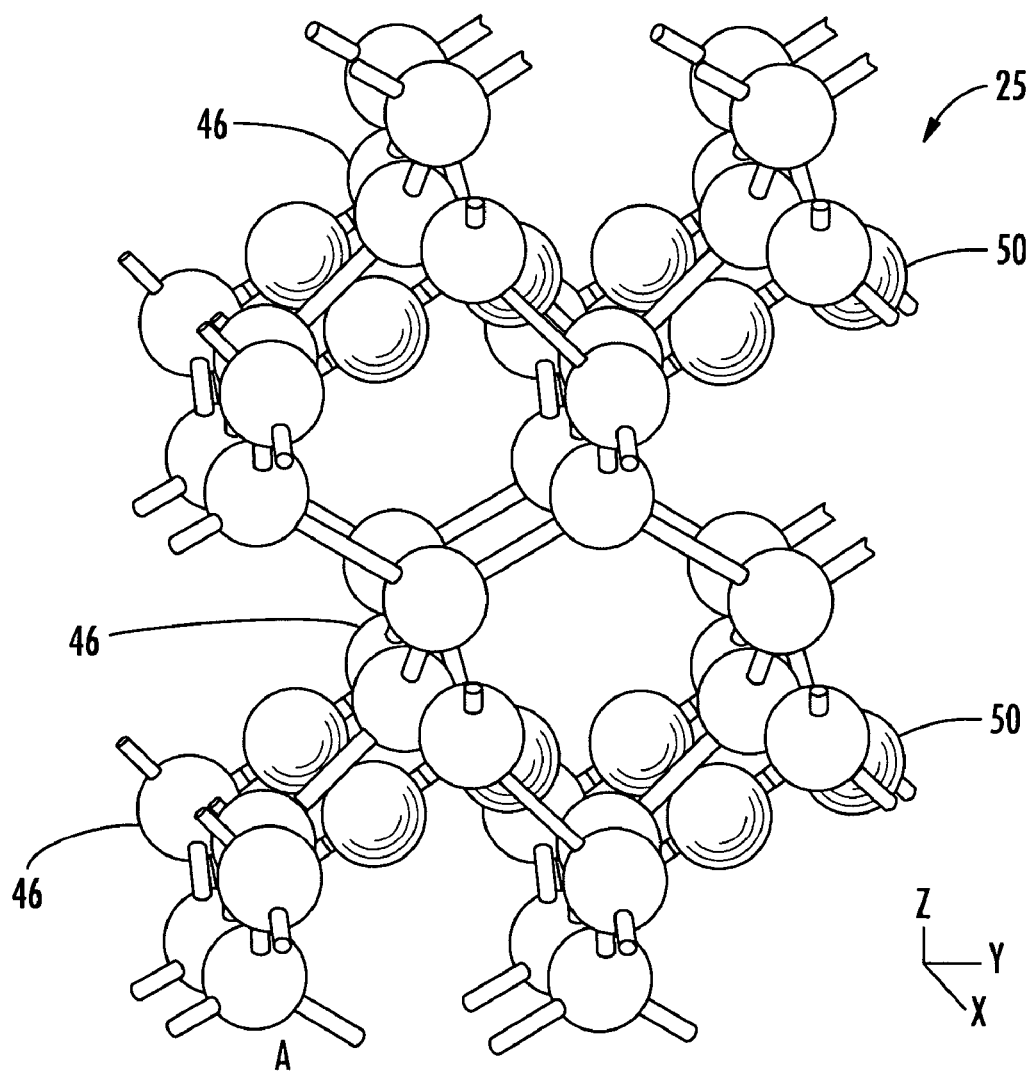
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band-modifying layers 50 may also cause the superlattice 25 to have a common energy band structure. The band modifying layers 50 may also cause the superlattice 25 to have a common energy band structure, while also advantageously functioning as an insulator between layers or regions vertically above and below the superlattice.

Moreover, this structure may also advantageously act as a barrier to dopant and/or material bleed between layers vertically above and below the superlattice 25. These properties may thus advantageously allow the superlattice 25 to provide an interface for high-K dielectrics which not only reduces bleeding of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer, It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
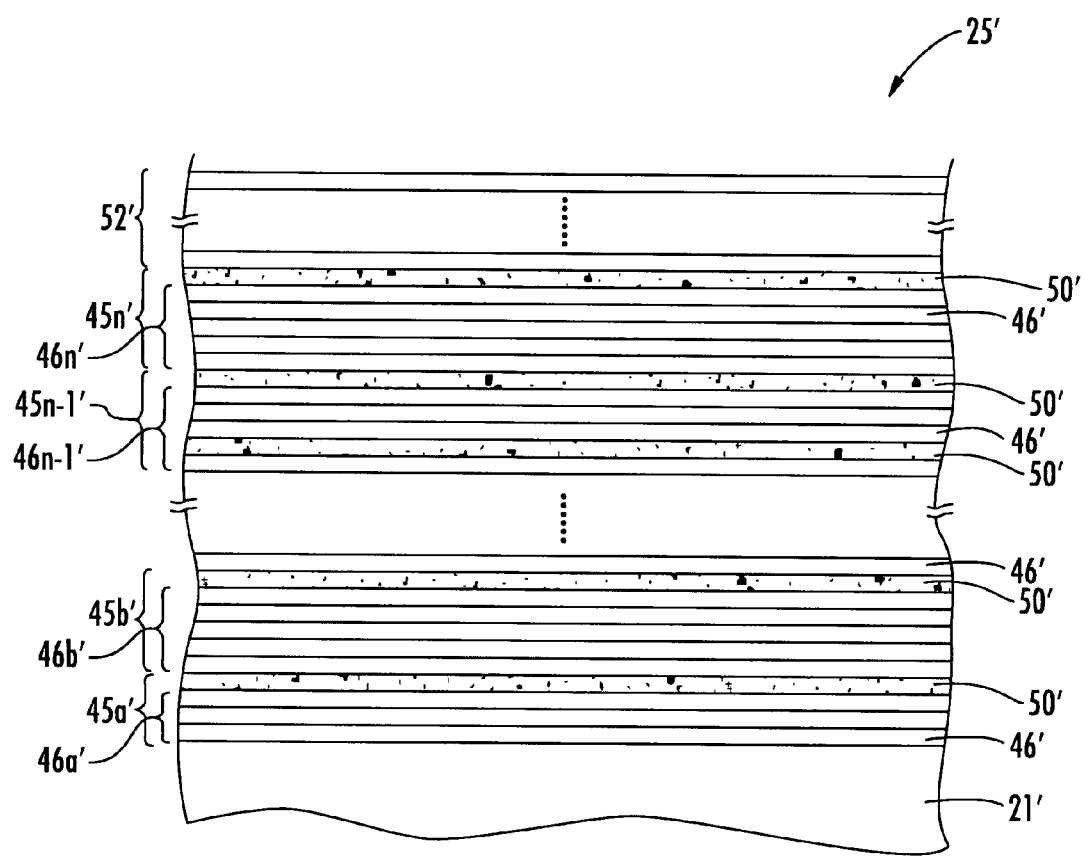
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
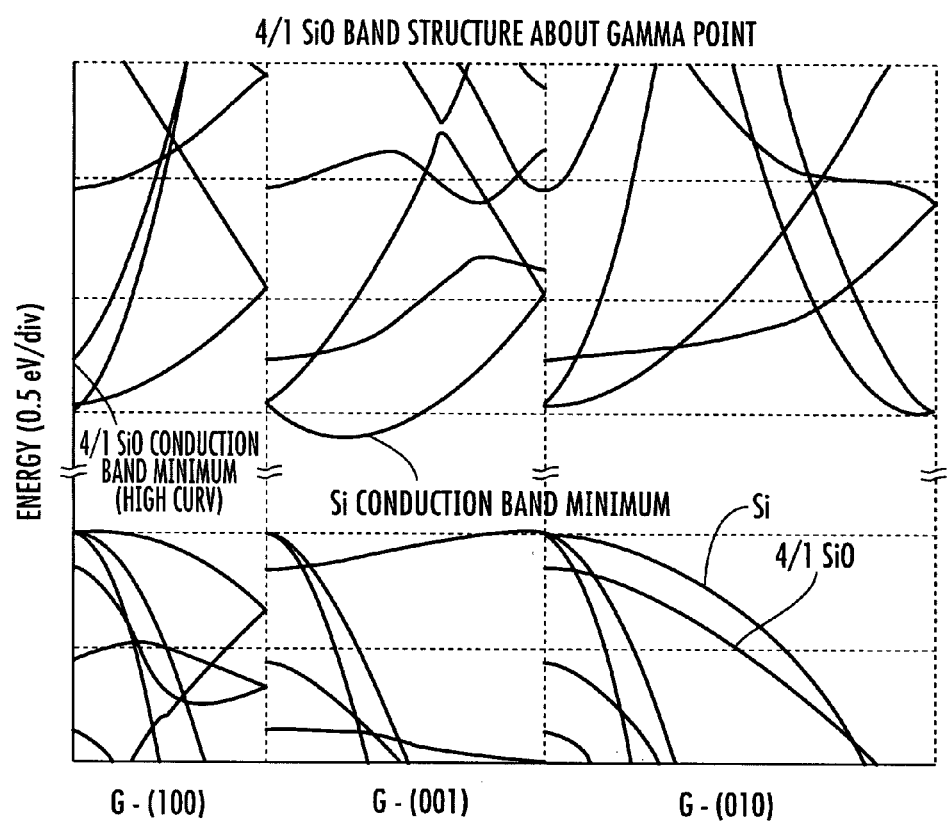
FIG. 4A is a graph of the calculated band structure from the gamma point (G) for both bulk silicon as in the prior art, and for the 4/1 Si/O superlattice as shown in FIGS. 1-2.
Figure 4B:
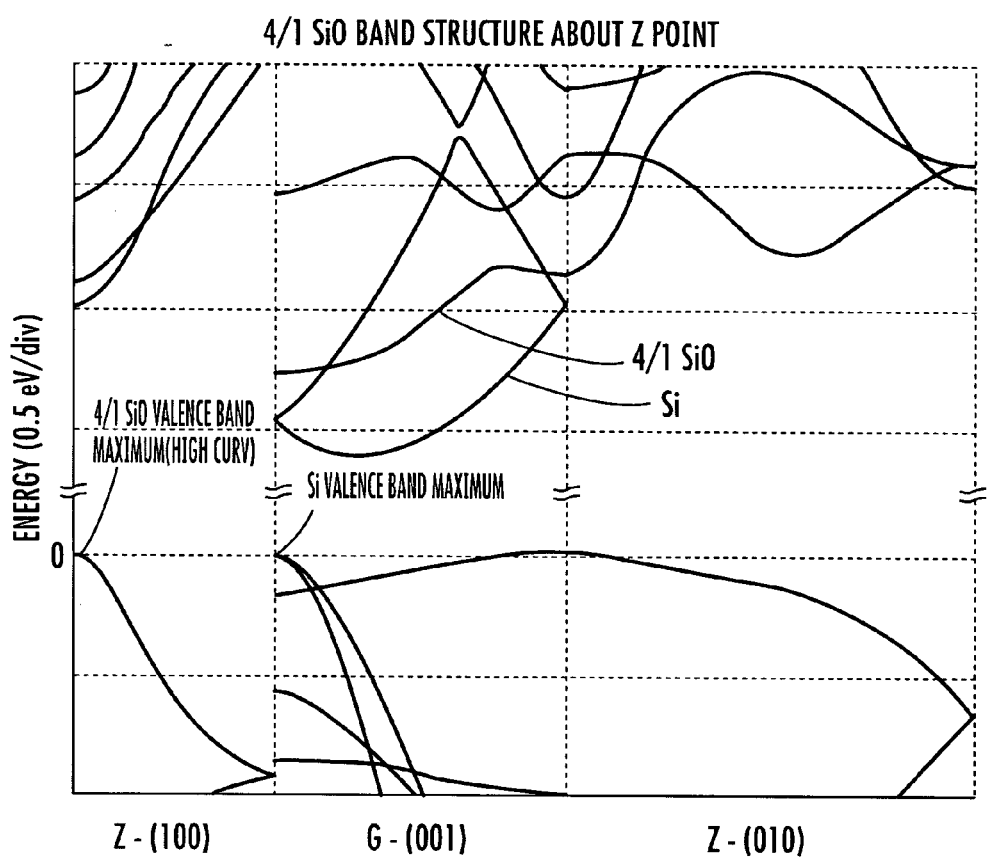
FIG. 4B is a graph of the calculated band structure from the Z point for both bulk silicon as in the prior art, and for the 4/1 Si/O superlattice as shown in FIGS. 1-2.
Figure 4C:
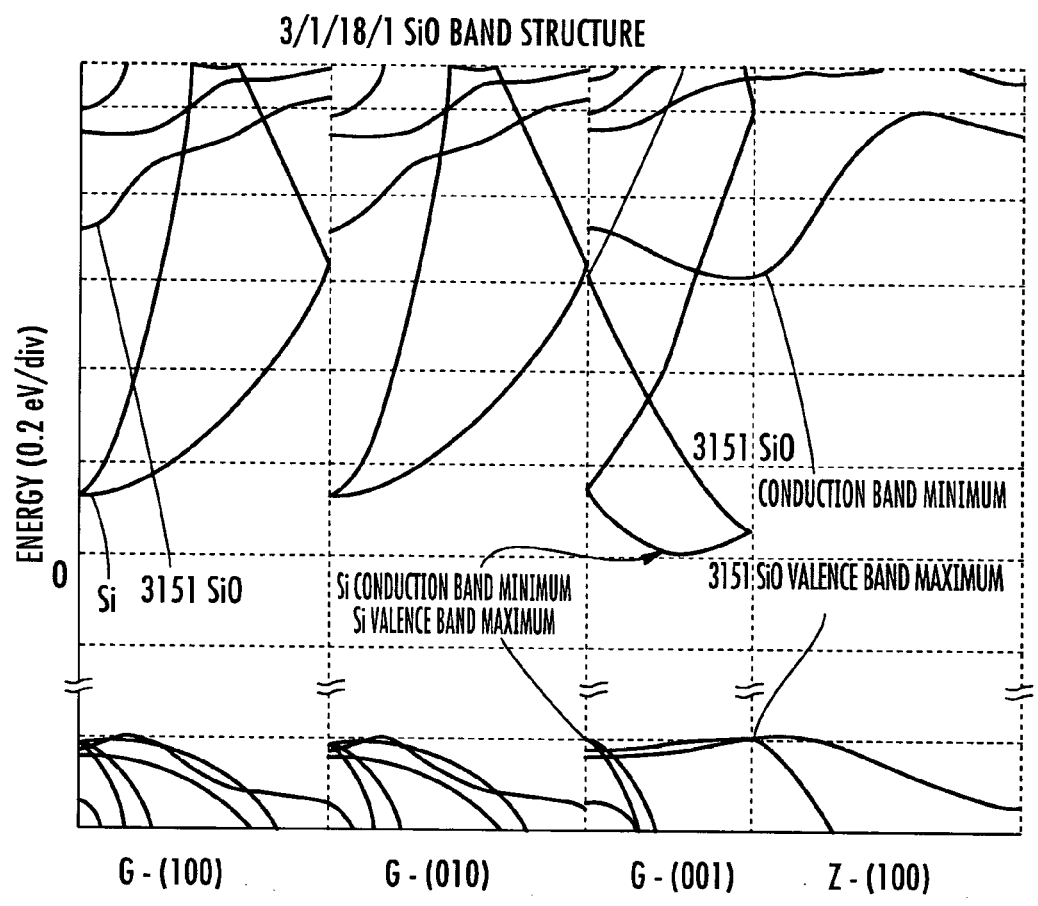
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010)

directions are equivalent, Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5A:
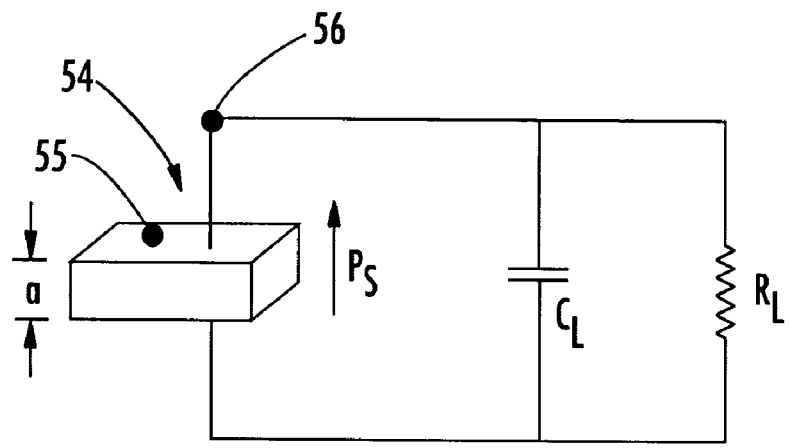
FIG. 5A is a schematic circuit diagram of a pyroelectric sensor in accordance with the present invention.
Figure 5B:
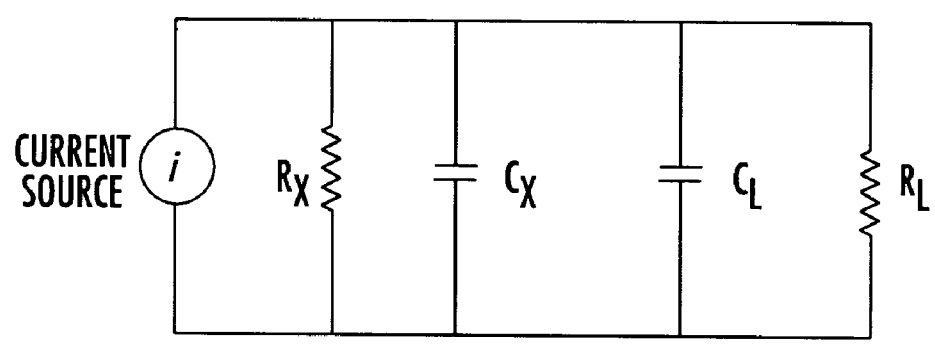
FIG. 5B is a schematic circuit diagram of an equivalent circuit for the pyroelectric sensor of FIG. 5A.
Figure 6A:
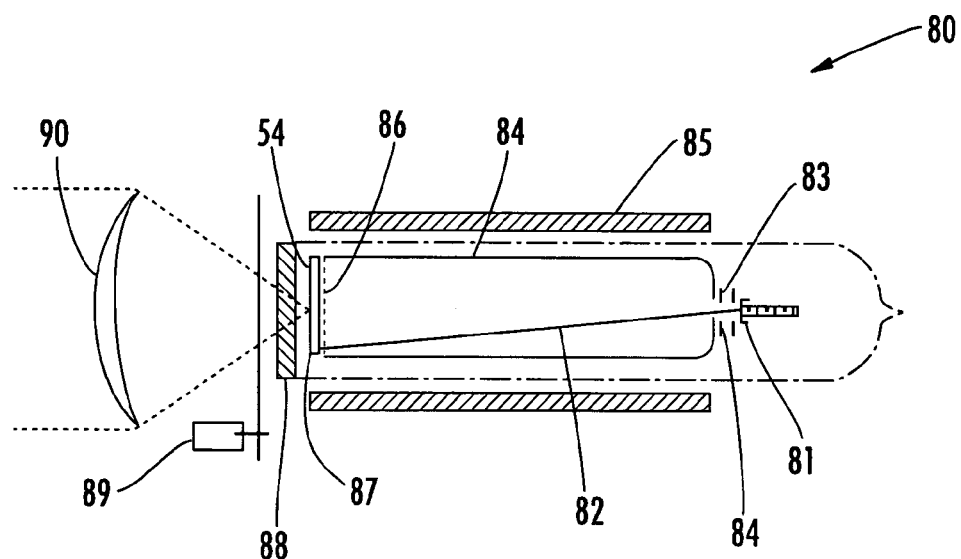
FIG. 6A is a schematic diagram of a pyro-vidicon tube system in accordance with the invention.
Figure 6B:
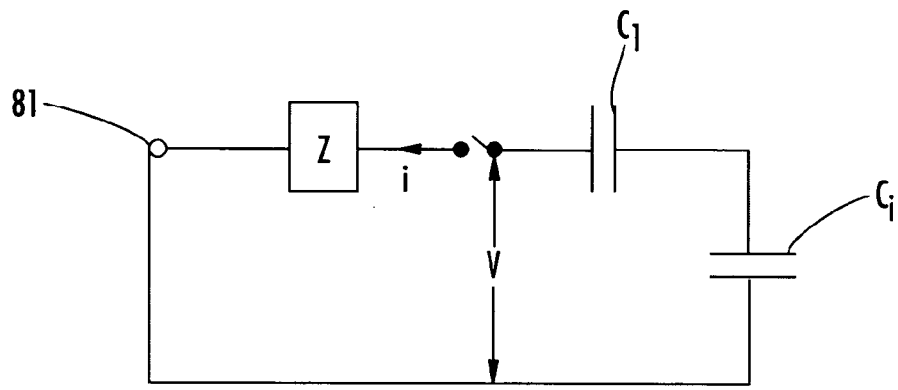
FIG. 6B is a schematic circuit diagram of an equivalent circuit for the tube system of FIG. 6A.

Turning now to FIGS. 5A through 5B, the above-noted superlattice structures may advantageously be used in a pyroelectric sensor 54 including a layer or film 55 of a superlattice material, such as the superlattice materials discussed above. Generally speaking, the above-described superlattice materials may be poled in such a way that they have a net electrical dipole moment, which advantageously gives the material piezoelectric and/or pyroelectric characteristics, as will be discussed further below. The pyroelectric sensor 54 is connected to a capacitor $C_L$ and resistor $R_L$, which are parallel-connected. In the schematic equivalent drawing of FIG. 6, the sensor 54 is represented as a current source I connected to a resistor $R_x$ and capacitor $C_x$, which are parallel-connected.

In the example shown in FIGS. 5A and 5B, the layer 55 of the superlattice material is both semiconductive and polar at the same time and can thus be used as a pyroelectric sensor, that is, a sensor for transducing optical/thermal energy into electrical energy, as will be appreciated by those skilled in the art. Stated alternatively, the poled superlattice layer 55 generates an electrical potential on an electrode 56 coupled thereto based upon thermal energy imparted to the poled superlattice. Of course, it will also be appreciated that the layer 55 could be used in a reverse manner to provide a pyroelectric actuator as opposed to a sensor.

The superlattice material layer 55 provides a relatively advanced pyroelectrically active material with an approximate p/Cp ratio of 30.0 for a silicon-oxygen superlattice structure. The superlattice film 55 when used in a sensor of a pyroelectric sensor device, such as the pyro-vidicon tube system 80 shown in FIGS. 6A and 6B, for example, is believed to have a high pyroelectric response based upon first-principle theoretical calculations. In the illustrated vidicon system embodiment, the target includes the pyroelectric sensor element 54. The superlattice film 55 advantageously provides a single-crystal non-toxic pyroelectric sensor structure that is semiconductive and polar at the same time, meets many high performance and operational requirements of pyrosensors, and may be relatively easily grown on existing semiconductive wafers, as will be appreciated by those skilled in the art.

Figure 8:
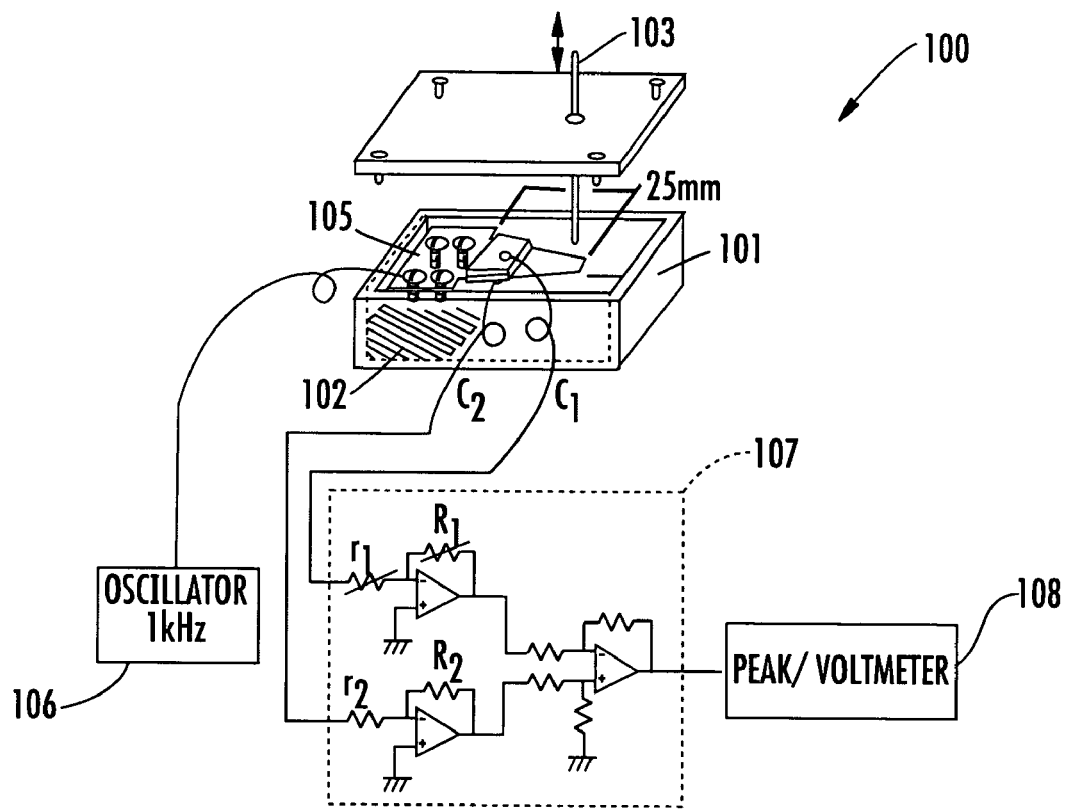
FIG. 8 is a perspective view of a pressure sensor including a superlattice and associated schematic circuit of electrical components thereof in accordance with the invention.

The thermal source in the pyro-vidicon tube system 80 is a cathode 81, which generates an electron beam 82 directed at the target. A grid 83 and first anode 84 are adjacent the cathode 81. Moreover, the tube system 80 also illustratively includes a wall anode 84 and focus and scan coils 85 adjacent the tube. A mesh 86 is positioned on the target facing the cathode 81, and a signal lead (i.e., electrode) 87 is also connected to the target. A germanium window 88 is positioned adjacent the target and opposite the cathode 81, followed by a chopper 89 and germanium lens 90, as will be appreciated by those skilled in the art. In the equivalent circuit diagram of FIG. 8, the target including the pyroelectric superlattice sensor 54 is represented by a capacitor $C_1$. An impedance element Z represents the beam impedance, and an input capacitance is represented by a capacitor $C_i$.

The quality of a pyrosensor is based upon high voltage or current responsivity. Large responsivity implies: a high pyroelectric coefficient ρ which describes the change of polarization based upon a change in the temperature; a high transmittance η of the incident radiation; low specific heat c; low mass density ρ; and low static dielectric constant ∈. Applicants theorize that use of the above-described superlattice materials in a pyroelectric sensor will result in these quantities numerically favoring a relatively high current or voltage pyroelectric responsivity comparable to or potentially greater than that of existing pyroelectric materials currently in use.

A pyroelectric sensor 50 including a superlattice film 55 as described above may provide numerous advantages over prior art sensors, such as: high pyroelectric responsivity imposed by a large pyroelectric coefficient and low specific heat; integratability with existing semiconductive wafers, since the superlattice material used has the same crystalline structure and a similar chemical composition as that of the wafer; the voltage or current responsivity may be relatively easily tuned by the change of the chemical composition using the same basic chemical ingredients of the material; the superlattice material is non-toxic, and more particularly, lead-free, and therefore more environmentally-friendly than current devices using lead, for example; Applicants theorize, without wishing to be bound thereto, that pyroelectric devices incorporating the superlattice films may be lighter by a factor of 2 compared to similar devices based on lead-containing sensor materials such as PLZT; and a relatively low cost of production.

Figure 9:
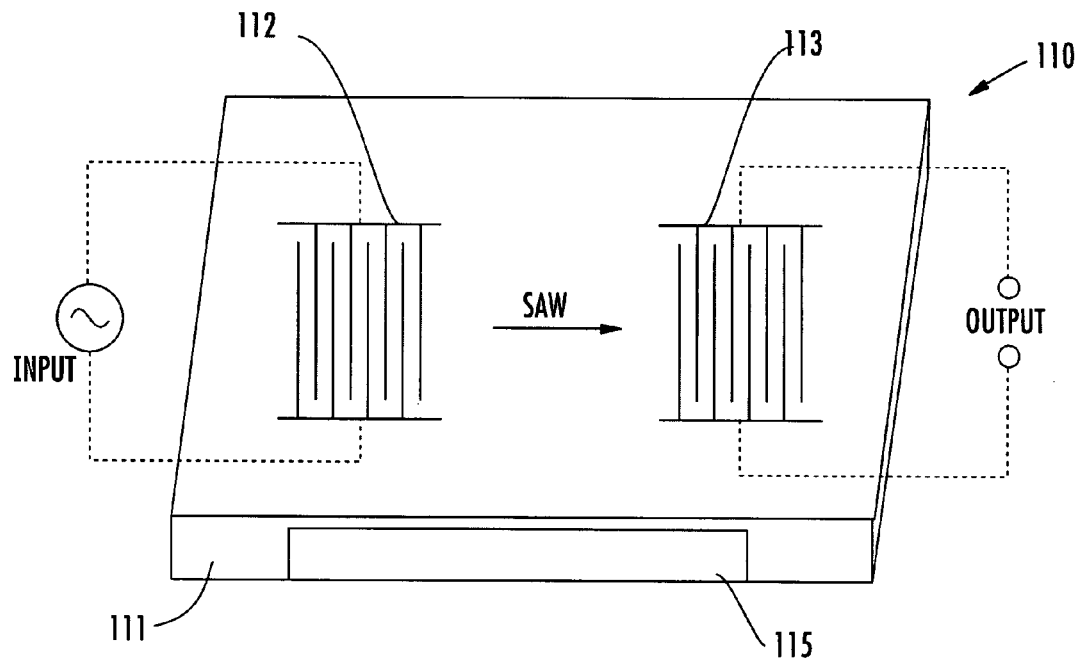
FIG. 9 is a schematic block diagram of a SAW device including a superlattice in accordance with the invention.
Figure 10:
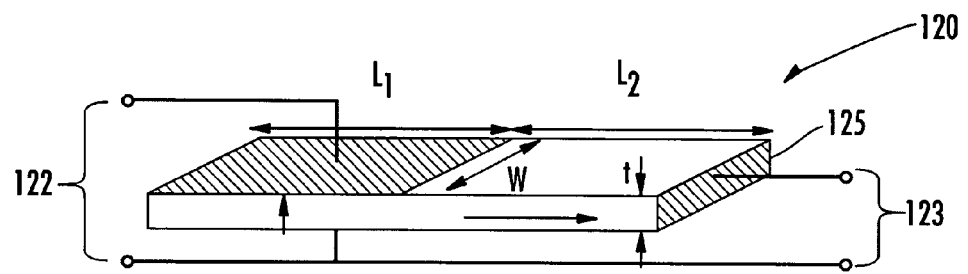
FIG. 10 is a schematic diagram of a piezoelectric transformer including a superlattice in accordance with the present invention.

Turning now additionally to FIGS. 9 and 10, the superlattice materials described above may advantageously be used as a piezoelectric material in numerous applications to generate an electrical potential, e.g., on an electrode. The superlattice 25 advantageously has desired piezoelectric properties when poled as noted above, is lead free (i.e., non-toxic), and can be relatively easily grown on current semiconductive wafers. By way of comparison with the above-described prior art piezoelectric materials, silicon-oxygen superlattice structures as described above have been determined to have the following properties set forth in Table 2 based upon first-principle theoretical calculations:

TABLE 2

| | d33, pC/N | g33, 10-3 Vm/N | k_33 | k | Qm | T_C, ° C. |
|---|---|---|---|---|---|---|
| Si—O Superlattice | 35 | 270 | 0.91(k'_33) | 0.68 | >10000 | 600 |

Accordingly, piezoelectric devices incorporating a superlattice film or layer 25 as described above may advantageously provide relatively high piezoelectric performance comparable or potentially superior to existing piezoelectric materials. More particularly, exemplary characteristics of such superlattice piezoelectric devices may be approximately as follows: voltage constant g=270; electromechanical coupling k=0.68; mechanical quality factor Qm>10000; and a Curie temperature T_C=600° C. for the phase transition between ferroelectric and paraelectric phases. The relatively high Currie temperature indicates a high resistivity of the superlattice material against "fatigue" and therefore structural stability of the material over a wide range of temperature change.

Figure 7:
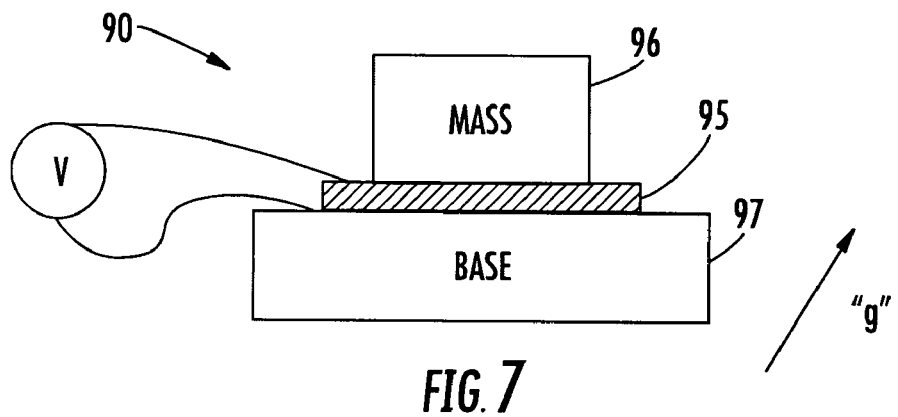
FIG. 7 is a schematic block diagram of a piezoelectric accelerometer including a superlattice in accordance with the invention.

One exemplary application for piezoelectric sensors incorporating a superlattice film or layer 95 is an accelerometer/gyroscope 90 as schematically illustrated in FIG. 7. Generally speaking, in this arrangement a superlattice layer 95 is positioned between a base 97 and a mass 96, and a voltage is measured across the superlattice layer which indicates the mechanical stress imparted thereon by the mass. Another exemplary implementation of an electrostatic bimorph-type stress sensor 100 including a polarized superlattice layer 105 is illustrated in FIG. 10. The sensor 100 illustratively includes a brass box 101, an acrylic base 102, and a stress sensing rod 103 carried by the brass box. The circuitry of the sensor 100 illustratively includes an oscillator 106 (e.g., 1 KHz), a differential amplifier 107, and a peak/voltmeter 108.

The superlattice piezoelectric material may be used in numerous other similar applications as well. By way of example, the superlattice material may be used in applications such as: piezoelectric pressure sensors/actuator; projectile guidance systems; platform stabilization systems for weapons, cameras, antennas, etc.; Global Positioning System (GPS) or other satellite navigation systems; automobile ride stabilization systems; underwater vehicle stabilization and navigation systems, etc., as will be appreciated by those skilled in the art.

Figure 11:
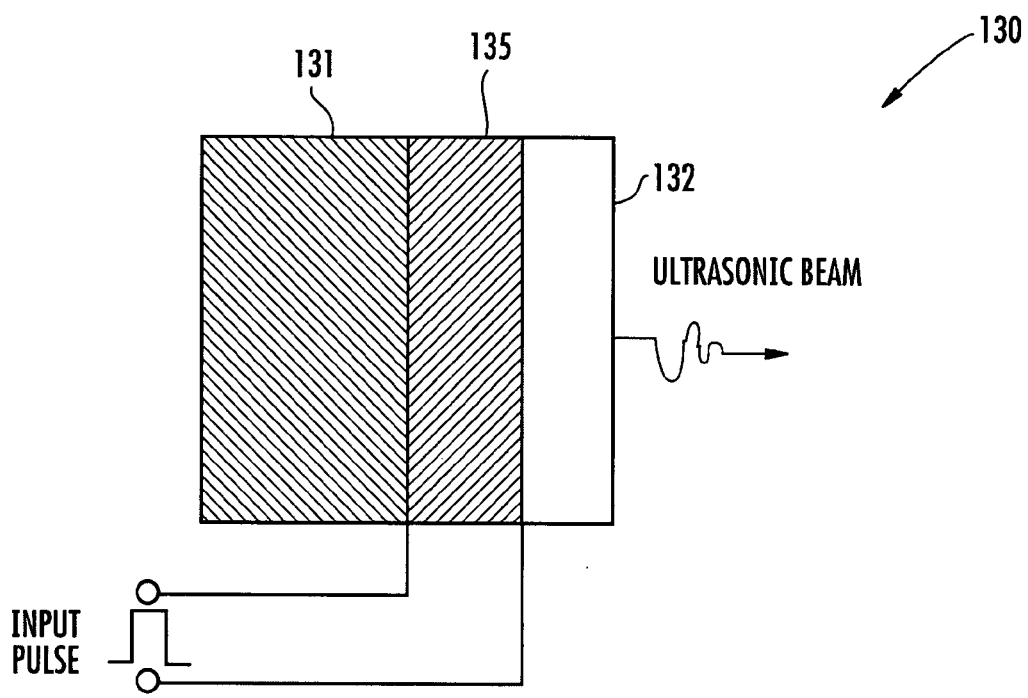
FIG. 11 is a schematic diagram of an acoustic transducer including a superlattice in accordance with the invention.

Various characteristics and advantages of the superlattice piezoelectric material which make it well suited for use in pressure sensors, accelerators, gyroscopes, etc., include the following: relatively high piezoelectric strain tensor d, which determines the magnitude of the induced strain η as a function of an applied electric field E; relatively high piezoelectric voltage tensor g, which determines the magnitude of the induced electric field as a function of an external stress strain σ; relatively high electromechanical coupling factor k, which represents the conversion rate between applied electrical energy and stored mechanical energy, or equivalently, the conversion rate between stored electrical energy and input mechanical energy, $k=d/\sqrt{\in S}$, where $\in$ is the dielectric tensor and S is the compliance tensor of the material; relatively low static dielectric constant $\in$; relatively high ratio between applied mechanical stress and output electrical signal imposed by a large piezoelectric voltage coefficient; relatively high quality of crystalline growth, which provides a relatively high mechanical quality factor Qm; relatively high Curie temperature, which provides a relatively high stability of the material over a wide range of temperature changes and relatively low sensitivity to the "fatigue" processes; relatively lighter than many current piezoelectric materials due to its relatively low mass density; may allow for miniaturization of pressure sensors and vibratory gyroscope devices as a result of its relatively high structural quality, high thermal stability (high TS), high electromechanical coupling k and high piezoelectric voltage coefficient g; includes chemically neutral ingredients and is therefore "environmentally friendly"; and relatively low cost of production, Turning now to FIG. 11, the above-described superlattice materials may advantageously be used in a piezoelectric bidirectional surface acoustic wave (SAW) filter device 110. More particularly, the electromechanical element of the SAW device 110 illustratively includes a base 111, input and output interdigitated electrodes 112 and 113 on opposing ends of the base, and a superlattice layer or film 115 carried by the base between the input and output electrodes which may provide the above-described piezoelectric characteristics desired for SAW applications. In the illustrated embodiment, the input and output electrodes 112 and 113 are interdigitated, although different electrode configurations may be used in different embodiments. Use of the superlattice layer 115 is particularly advantageous in that it is lead free (i.e., non-toxic) and may be relatively easily grown on existing semiconductor wafers.

The bi-directional SAW filter device (i.e., transducer) 110 radiates energy equally from each side thereof. The SAW wavelength may be on the same order as the line dimensions produced by photolithography, and the lengths for both short and long delays may be achieved on reasonably sized substrates, as will be appreciated by those skilled in the art. Moreover, the wave may be electro-acoustically accessed and tapped at the substrate surface, and its velocity may be approximately 10000 times slower than an electromagnetic wave.

Several factors which make the above-described piezoelectric superlattice material well suited for use in SAW applications such as those noted above are as follows: relatively high electromechanical coupling coefficient k; relatively high quality of crystalline growth, which results in a relatively high mechanical quality factor Qm and suitability for minimizing propagation loss (this is an important factor in determining the insertion loss of a device and it is caused by wave scattering at crystalline defects and surface irregularities); Applicants theorize, without wishing to be bound thereto, that the piezoelectric superlattice materials provide a relatively high surface wave coupling factor $k^2=2(v_f-v_m)/v_f$, where $v_f$ is the free surface wave velocity and $v_m$ is the velocity on the metallized surface (this is used to short-circuit the piezoelectric field associated with the wave that passes across the surface); Applicants also theorize, without wishing to be bound thereto, that the piezoelectric superlattice materials provide a relatively small temperature coefficient of delay (TCD); relatively high Curie temperature, which provides a relatively high stability of the piezoelectric superlattice material over a wide range of temperature as well as low sensitivity to "fatigue"; the piezoelectric superlattice material may be lighter than the many traditional piezoelectric materials due to its relatively low mass density; may allow for miniaturization of the pressure sensor and vibratory gyroscope devices as a result of the relatively high structural quality of the material, high thermal stability (i.e., high T_C), high electromechanical coupling k and high piezoelectric voltage coefficient g; contains chemically neutral ingredients and is therefore "environmentally friendly" and non-toxic as opposed to lead-based piezoelectric materials, for example; and relatively low cost of production.

Turning now additionally to FIG. 10, the above-described superlattice materials may also advantageously be used in a piezoelectric voltage transformer 120. More particularly, the piezoelectric voltage transformer 125 is a Rosen-type piezoelectric transformer that includes a layer or film 125 of a bi-axially polarized superlattice connected to low and high voltage inputs 122, 123 as shown. In the illustrated embodiment, the arrows indicate the orientation of the electric polarization in different portions of the piezoelectric superlattice layer 125.

The piezoelectric superlattice layer 125 advantageously provides the above-described desired operating characteristics, it is lead free (i.e., non-toxic) and it is relatively easily grown on existing semiconductor wafers. Again, the piezoelectric superlattice layer 125 is believed to have a relatively high piezoelectric performance on the basis of first-principle theoretical calculations. As noted above, the bi-axially polarized superlattice layer 125 is believed to have the following piezoelectric characteristics: piezoelectric voltage constant g=270; electromechanical coupling constants k'_33=0.91 (longitudinal length extension mode), mechanical quality factor Qm>10000; and a Curie temperature TC of about 600° C. for the phase transition between ferroelectric and paraelectric phases, which indicates a relatively high resistivity against "fatigue" and thus structural stability of the material over a wide range of temperature change.

Other factors which may make the superlattice piezoelectric material particularly advantageous for use in piezoelectric transformer devices are as follows: relatively high electromechanical coupling coefficient k; relatively high quality of crystalline growth, which provides a high mechanical quality factor Qm; relatively high Curie temperature, which provides relatively high stability of the material over a wide range of temperature change and low sensitivity to fatigue; lighter than typical piezoelectric materials due to its relatively low mass density; potential for miniaturization of the vibrators/ultrasonic transducer and shape memory devices due to the relatively high structural quality of the material, high thermal stability (high T_C), high electromechanical coupling k, and reasonable piezoelectric strain constant d; includes chemically neutral ingredients and is therefore "environmentally friendly"; and relatively low cost of production.

Turning now additionally to FIG. 11, the above-described superlattice materials may advantageously be used in high performance piezoelectric vibratory devices such as a transducer 130. More particularly, the transducer 130 illustratively includes a polarized superlattice layer or film 135 positioned between a backing layer 131 and a matching layer 132, as will be appreciated by those skilled in the art. The superlattice layer 135 is believed to provide the above-described desired characteristics for piezoelectrics based upon first-principle theoretical calculations. Moreover, the superlattice layer 135 is also lead free (i.e., non-toxic), relatively highly stable (low-fatigue), relatively highly tunable through changes of the chemical composition, and it may be relatively easily grown on the existing semiconductor wafers.

Figure 12:
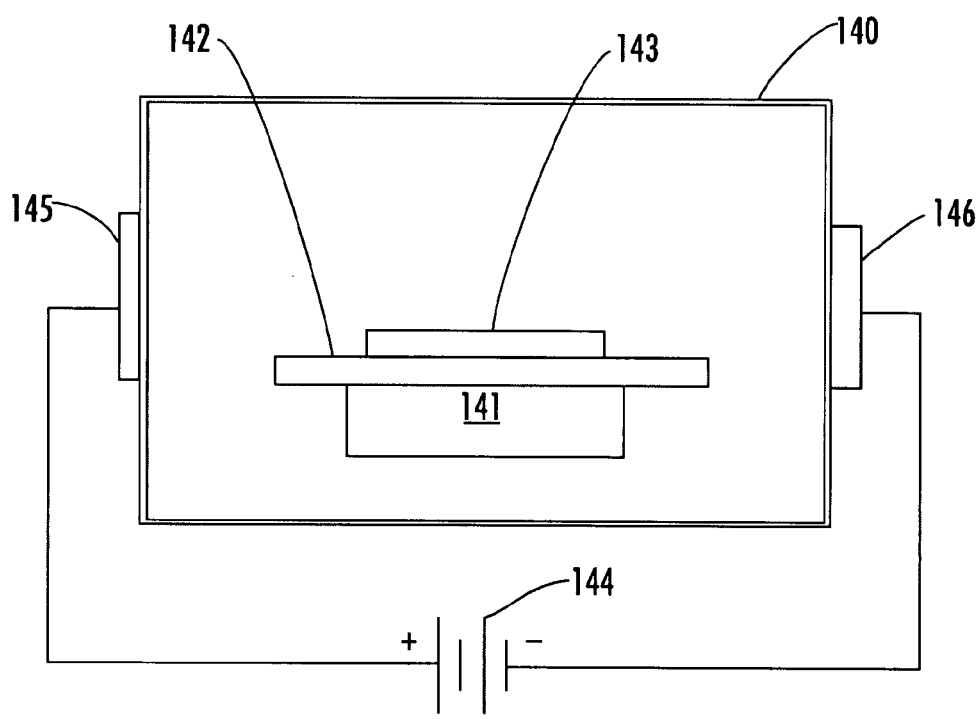
FIG. 12 is a schematic block diagram of a deposition chamber used in the formation of a poled superlattice in accordance with the invention.

Other factors which make the superlattice piezoelectric material particularly attractive for use in piezoelectric vibrators, ultrasonic transducers (e.g., sonars for ultrasonic imaging, etc.), frequency energy-trapped filters, etc., are as follows: relatively high electromechanical coupling coefficient k; relatively high quality of crystalline growth, which provides a relatively high mechanical quality factor Qm; relatively high Curie temperature, which provides high stability of the material over a wide range of temperature change and low sensitivity to "fatigue"; lighter than typical piezoelectric materials due to is relatively low mass density; potential for miniaturization of the vibrators/ultrasonic transducer and shape memory devices due to the relatively high structural quality of the material, relatively high thermal stability (high T_C), relatively high electromechanical coupling k, and reasonable piezoelectric strain constant d; includes chemically neutral ingredients and is therefore "environmentally friendly"; and relatively low cost of production, The above-described piezoelectric and pyroelectric embodiments utilize a superlattice materials that is poled, such as at the time of manufacture, to provide a net dipole moment that remains during operation of the device (i.e., it may be considered a "permanent" dipole). One exemplary method for making such a piezoelectric or pyroelectric superlattice film is now described with reference to FIG. 12. in which a material deposition chamber 140 is shown. A heater 141 is positioned within the chamber and thermally coupled to a base or holder 142 for holding a wafer 143 (e.g., a silicon wafer) for processing.

At the desired point in the fabrication process of the superlattice film on the wafer 143 (e.g., after deposition of all of the layers 45a-45n and, optionally, the cap layer 52), the superlattice 25 is preferably heated to a relatively high temperature. More particularly, the superlattice 25 is heated to a temperature near or above the Curie temperature thereof, and then exposed to a voltage field via a voltage source 144 coupled to electrodes 145, 146. By way of example, exemplary processing parameters for a silicon-oxygen superlattice with a Curie temperature of about 600° C. may include exposure to an electrical field of about 1 to 100 kV/m at a temperature of about 600 to 1000° C. for a duration of about 10 to 90 seconds. However, other processing parameters outside of these ranges may be used in some embodiments. Moreover, the electrical poling may occur prior to deposition of all of the layers of the superlattice 25 in some embodiments.

Figure 13A:
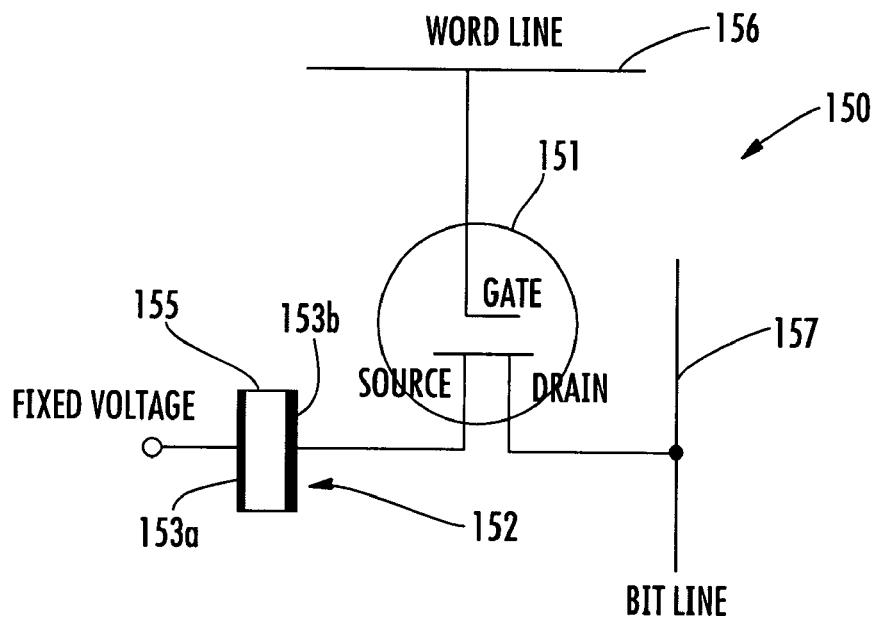
FIG. 13A is a schematic diagram of a non-volatile ferroelectric memory element in accordance with the present invention.
Figure 13B:
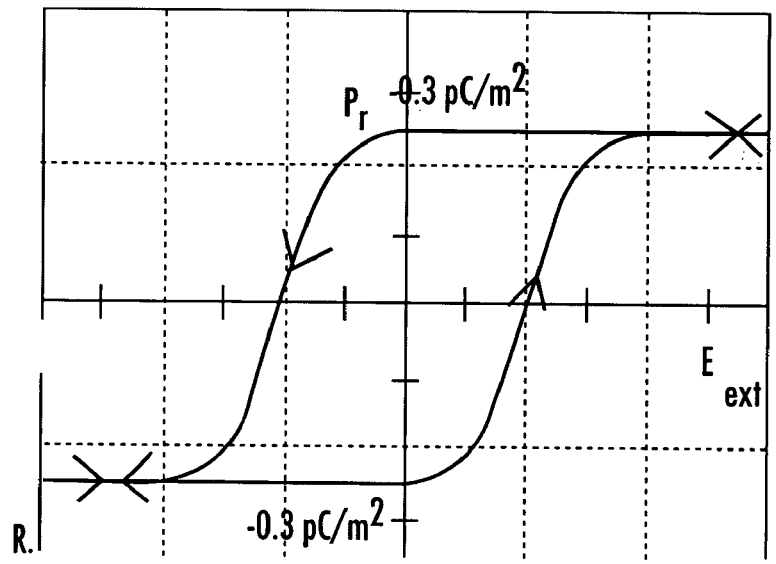
FIG. 13B is a graph of an exemplary hysteresis curve for the non-volatile ferroelectric memory element of FIG. 13A.

However, in some embodiments the superlattice 25 may be selectively poled during operation of the device, rather than being permanently poled ahead of time (such as during the manufacturing processes) to provide a ferroelectric material. Referring now to FIGS. 13A-13B, the above-described superlattice structures may advantageously be used for a non-volatile ferroelectric memory element or cell 150. Generally speaking, in a memory element embodiment a superlattice layer is coupled to one or more electrodes for selectively poling the superlattice as needed during operation thereof, as will be appreciated by those skilled in the art. In the present example, the memory element 150 illustratively includes a MOSFET 151 having a gate connected to a word line 156, a drain connected to a bit line 157, and a source. The memory cell 150 further illustratively includes a capacitor 152 connected between a fixed voltage reference and the source of the MOSFET 151, The capacitor 152 comprises a superlattice layer or film 155 between conductive plates 153a, 153b. The superlattice film 155 has ferroelectric properties and a square-loop hysteresis curve (FIG. 13B) which are particularly useful in the context of the memory element 150, as will be appreciated by those skilled in the art.

More particularly, the superlattice film 155 provides a ferroelectric material having reduced sensitivity to oxygen vacancies due to its structure and chemical composition, as discussed further above, as well as the ability to mitigate ion diffusion. For a silicon-oxygen implementation, for example, the superlattice layer 155 advantageously has the following features: a relatively high Curie temperature of about 600° C.; a relatively high value of remnant polarization $P=0.30$ $C/m^2$; a square-type polarization hysteresis loop, tunability of the remnant polarization and the shape of the hysteresis by a change of composition of the superlattice; a relatively low level of ion diffusion; and a relatively low sensitivity to the migration of oxygen vacancies.

Use of the superlattice ferroelectric material layer 155 in the non-volatile memory element 150 may provide the following advantages/benefits: a relatively high Curie temperature of about 600° C.; a relatively high value of remnant polarization $P=0.30$ $C/m^2$, and a square-type polarization hysteresis loop; tunability of the remnant polarization, coercive field and the shape of the hysteresis by the change of composition of the superlattice layer; a relatively low level of ion diffusion; a relatively low sensitivity to the migration of the oxygen vacancies; relatively easy integration with existing semiconductive wafers, since the superlattice structures have the same crystalline structure and similar chemical composition and is also a semiconductor as well; the quality of crystalline growth is not critical, which means the ferroelectric and dielectric properties of the superlattice material may be tuned by the change of the chemical composition using the same basic chemical ingredients of the material; and a relatively low cost of production.

Turning now to FIGS. 14A-14D, the above-described superlattice materials may also advantageously be used as the ferroelectric material in a MFSFET 160 for use in a non-volatile memory cell array, for example. More particularly, the MFSFET 160 illustratively includes an N-type semiconductor substrate with spaced-apart P and P+ source and drain regions 162, 163 formed therein and defining a channel region therebetween. The illustrated example is a semiconductor or silicon-on-insulator (SOI) embodiment which includes an insulating layer (e.g., $SiO_2$) 164 overlying the substrate 161. The superlattice layer 165 overlies the insulating layer 164, and a gate layer 166 overlies the superlattice layer. The MFSFET 160 further illustratively includes sidewall spacers 167a, 167b, as well as source and drain contacts 168a, 168b and a gate contact 169, as will be appreciated by those skilled in the art.

The selectively potable ferroelectric superlattice 165 advantageously provides reduced sensitivity to oxygen vacancies due to its unique structure and chemical composition as well as mitigation of ion diffusion. More particularly, when a film or layer of the superlattice material 165 is used in the MFSFET 160, the drain current will develop a hysteresis loop (FIG. 14B) as a function of applied gate voltage. The lower voltage indicates one orientation of the polarization, and the higher value indicates the opposite orientation of the polarization in the film.

The superlattice film 165 used in the MFSFET 160 has a relatively high Curie temperature of about 600° C. for a silicon-oxygen structure, a relatively high value of remnant polarization $P=0.30$ $C/m^2$, and a square-type polarization hysteresis loop. Moreover, the superlattice film 165 also allows for tuning of the remnant polarization and the shape of the drain current vs. gate voltage hysteresis by changing the composition of the film. Furthermore, it also provides a relatively low level of ion diffusion, and a relatively low sensitivity to the migration of the oxygen vacancies.

Additional advantages of using a superlattice film 165 as a ferroelectric material in a non-volatile memory device are that the superlattice has a relatively high integratability with existing semiconductive wafer, since the superlattice has a crystalline structure and similar chemical composition. Moreover, the quality of crystalline growth is not particularly critical, so the ferroelectric and dielectric properties of the superlattice 165 may be tuned by changing the chemical composition of the superlattice. Use of superlattice films for this application may also result in a relatively low cost of production.

Figure 14A:
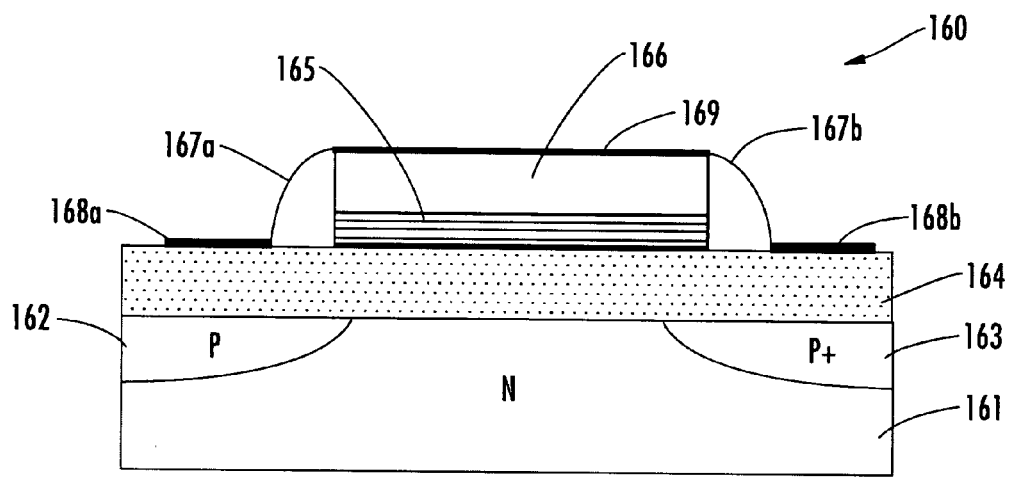
FIG. 14A is a schematic diagram of a MFSFET including a superlattice in accordance with the invention for use in a non-volatile memory device.
Figure 14B:
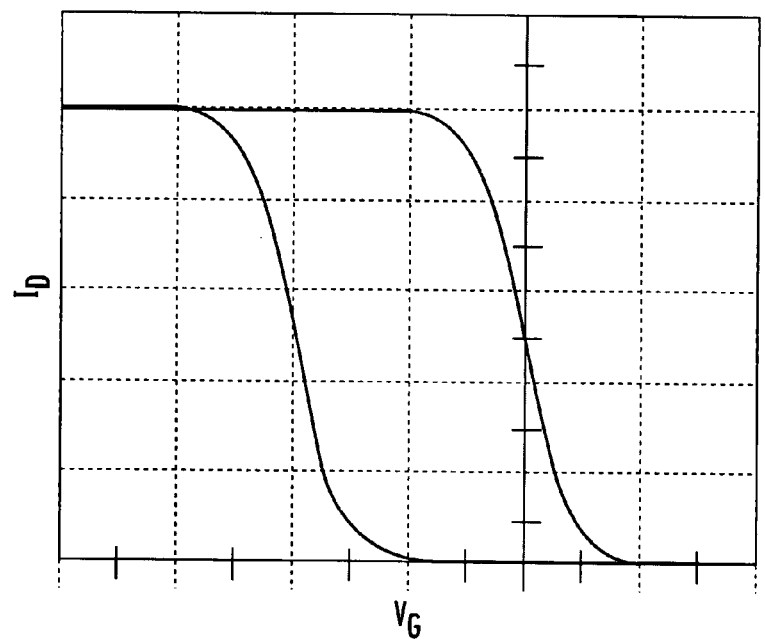
FIG. 14B is a graph of a hysteresis curve for the MFSPET of FIG. 14A.
Figure 14C:
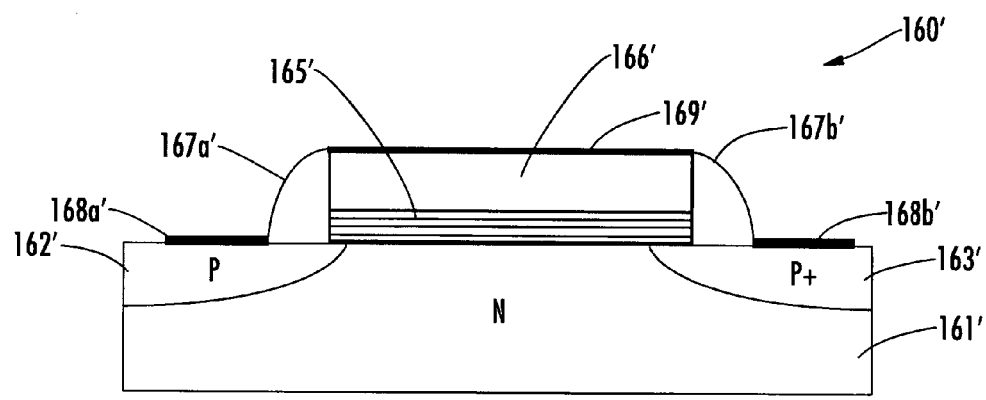
FIG. 14C is a schematic cross-sectional view of an alternative non-SOI embodiment of the MSFET of FIG. 14A.

Referring to FIG. 14C, a similar MSFET 160' to the one described above is shown which is not an SOI implementation. That is, because of the advantageous insulating properties of the superlattice layer 165' described further above, in such embodiments the gate insulating layer (the SOI insulating layer 164 in the above-described example) may be omitted, and the superlattice layer 165' may advantageously function not only as the gate ferroelectric but also as the gate insulator as well, as will be appreciated by those skilled in the art. In this embodiment, the superlattice layer may advantageously be formed directly on the substrate 161' and have a same crystalline structure thereof, such as monocrystalline silicon, for example.

In the above-described SOI embodiment, the superlattice layer 165 may be formed on a separate semiconductor substrate and then transferred to the SOI substrate 161, as will be appreciated by those skilled in the art. Further details on implementing the above-described superlattice materials in an SOI configuration are set forth in co-pending U.S. application Ser. Nos. 11/381,835 and 11/428,015, which are assigned to the present Assignee and are both hereby incorporated herein in their entireties by reference.

Figure 14D:
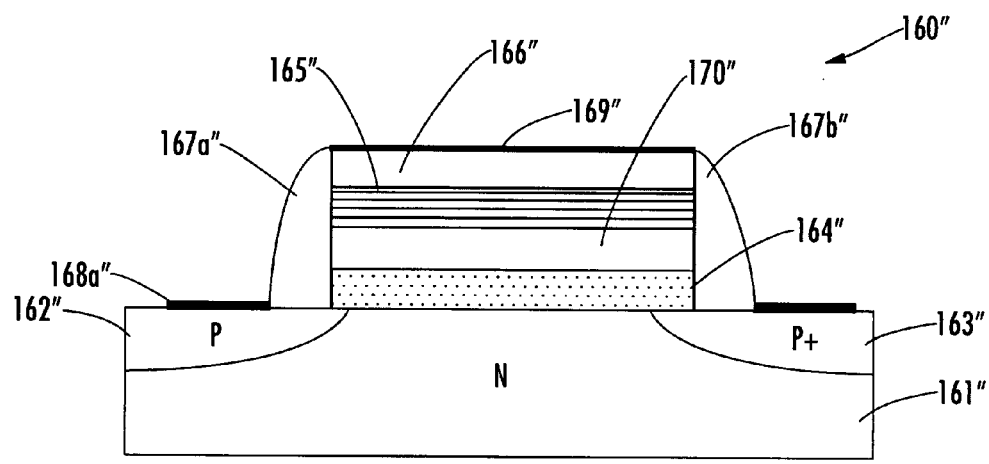
FIG. 14D is a schematic cross-sectional view of an alternative embodiment of the MSFET of FIG. 14C with a floating gate.

A floating gate embodiment of a MSFET 160" is shown in FIG. 14D. Here, the gate stack includes an insulating layer 164" overlying the channel region in the substrate 161", a floating gate layer 170" overlying the insulating layer, the superlattice layer 165" overlying the floating gate layer, and the gate layer 166" (i.e., the control gate layer) overlies the superlattice layer. Of course, various configurations other than those discussed above may be used in different embodiments. Moreover, different conductivity types and concentrations other than those provided in the above-noted examples may also be used, as will be understood by the skilled artisan.

The above-described superlattice materials and the piezoelectric, pyroelectric, and ferroelectric characteristics thereof will be more fully understood base upon the following discussion beginning initially with reference to FIG. 15. Determination of the phonon or vibrational spectra in general serves as one of the most efficient tools for studying lattice instability and establishing the material's phase diagram (or at least basic trends), from zero-temperature calculations. Analysis of lattice instabilities of the prototype paraelectric (non-polarized) phase, characterizing the thermodynamic state of the oxide-containing systems above the Curie temperature TC, is one of the well-developed methods in establishing all possible structural transitions to low-symmetry polarized phases below $T_c$. Diversity of thermodynamic behavior, including phase transitions of order-disorder or displacive kind, is largely justified by the level of saturation of covalent bonds between cations and oxygens and the local symmetry of the bonding orbitals.

Figures 15A, 15B:
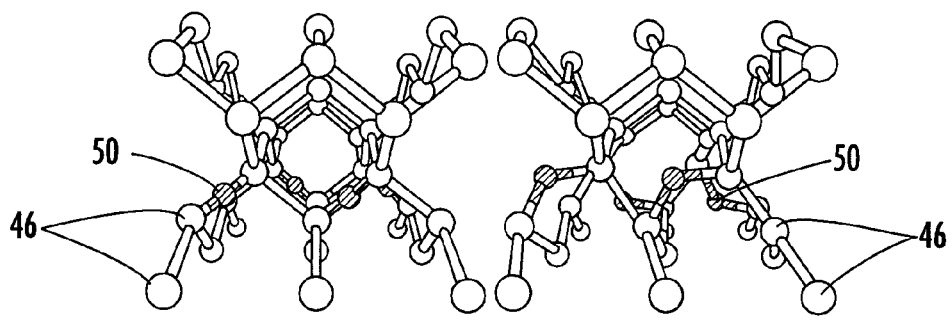
FIGS. 15A and 15B are perspective schematic atomic diagrams of portions of a silicon-oxygen superlattice for use in electronic devices in accordance with the present invention.

In view of multilayered structure, a $(SiO_m)/Si_n$ superlattice in its prototype paraelectric phase has Pmna symmetry of orthorhombic system, which vibrational modes can be reduced to 2 two-dimensional irreducible representations in Γ-point. According to the total energy symmetry-constraint calculations, this structure, shown in FIG. 15A, is relatively unstable. An overlap between $sp^3$-type orbitals on Si sites and practically pure p-orbitals on interstitial oxygen sites leads to a relatively strong covalent σ-bonding, implying a stable Si—O bonding length of approximately 1.60 Å in the first place, whereas the length of Si—Si bonds in the maternal diamond host is about 2.75 Å. Therefore, the Si—O—Si unit would cause a certain internal tensile stress in the original diamond host if the angle of the unit bending were constraint to 180°, since the total length of the straightened unit 3.2 Å considerably exceeds that of unperturbed Si—Si bonding. On the other hand, there is a considerable effect of contraction along the x-axis, which is normal to the Pmna mirror plane at our choice for the coordinate frame.

Figure 16:
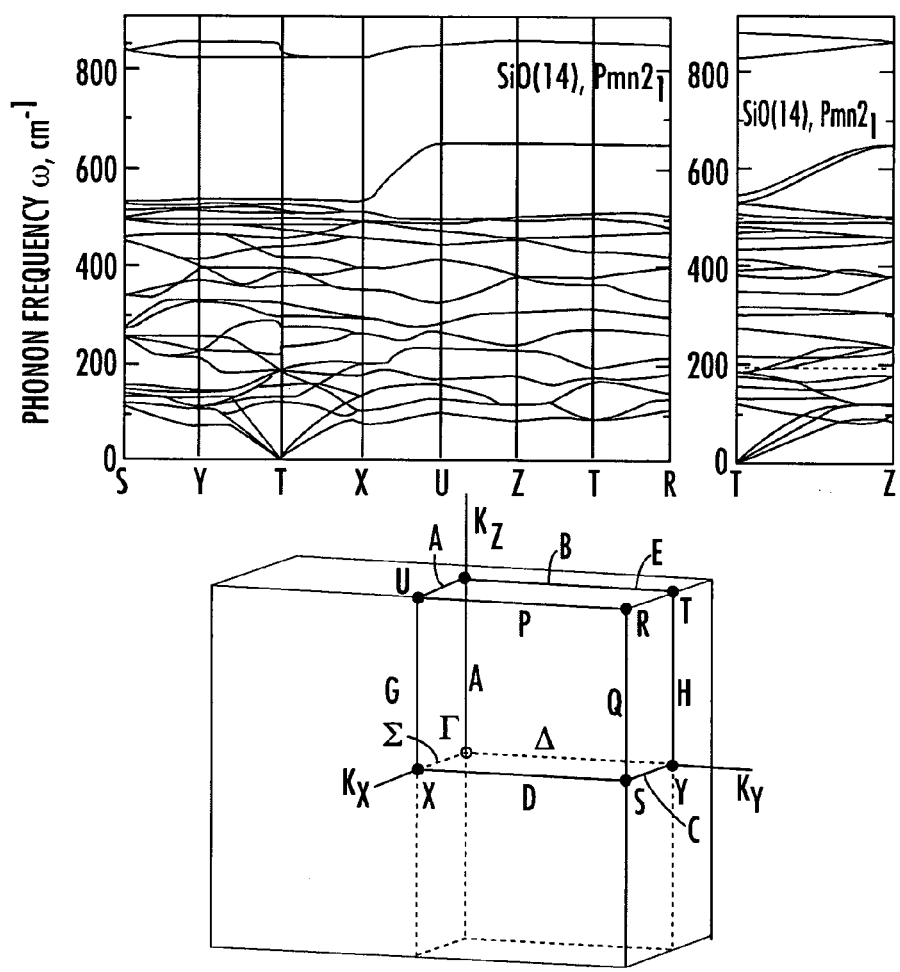
FIG. 16 is a graph and associated 3D representation of phonon dispersion in an $(SiO)_1/Si_3$, relaxed $Pmn2_1$ symmetry, silicon-oxygen superlattice in accordance with the invention.

The tensile stress, applied within the (z-y) mirror plane, is big enough to amount the bending angle of the Si—O—Si unit to 138°, as shown in FIG. 15B, under the condition that the superlattice is grown on the (001) Si substrate, which is currently in the x-z plane, and a lattice optimization is performed. As a result of the tensile stress applied along the mirror, the transversal contraction through the Si—Si bonding turns out to be strong enough to reduce the superlattice equilibrium volume of the orthorhombic non-centric $Pmn2_1$ superlattice structure as compared to that of the substrate by nearly 10 percent. This considerable strain effect turns to be coupled with ferroelectric mode, as justified by first-principles Berry's phase calculations. Here, we perform a detailed analysis of the lattice vibrational eigenmodes in order to demonstrate the displacive nature of the ferroelectricity due to the lattice distortion/strain. Placing the oxygens in the middle of Si—Si bonding enriches the phonon spectra of silicon with a set of optical branches, and has a considerable anisotropic effect on the original Si acoustic branches, an easy observation from FIG. 16, where the phonon spectra of pure Si and SiO(14) superlattice are shown. The optical branches have remarkably low dispersion, which indicates their rather local character with a correlation length as short as the size of the primitive cell. Note, the local character of the Si—O—Si optical vibrations has been corroborated by calculations of the phonons in superlattice systems with different coverage of oxygen, preserving their disperionlessness in all cases.

Figure 17:
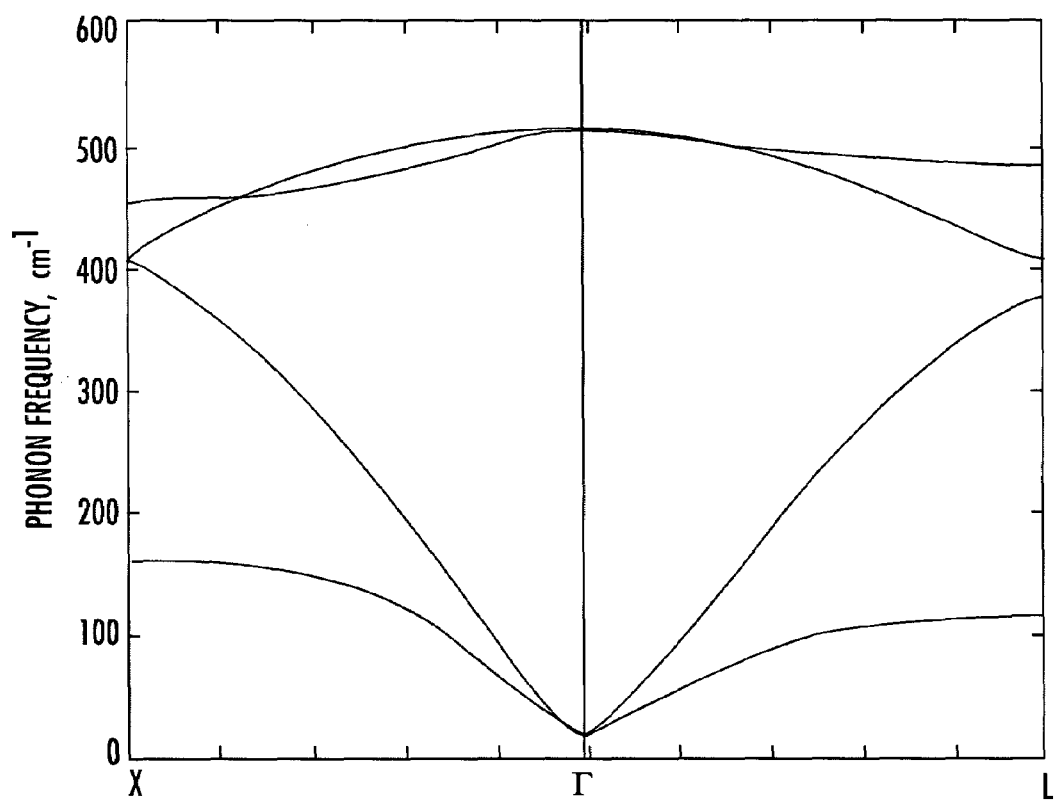
FIG. 17 is a graph of the phonon spectrum for pure silicon along high-symmetry directions in the Pmmm Brillouin zone.

The kinks around Γ-point are explained by non-analytical behavior of the phonon branches caused by the coupling of longitudinal polar displacement to a macroscopic polarizing field. Note that the splitting between longitudinal and transversal optical modes at the zone center has the maximum value of about 50 cm$^{-1}$ for the vibrations with the highest energy, which correspond to the polar radial oscillations of the Si—O bonds, with an effective mode charge of about ~7.0. We will turn to that and related issues by contrasting lattice dynamics of the Pmn2$_1$ structure and that of hypothetic high-temperature Pmna phase. Because of symmetry reduction and anisotropy of the effective dynamic charges, there is also an additional splitting between transversal acoustic branches in SiO(14) superlattice not present in pure silicon, which phonon spectrum is shown in FIG. 17.

To envision the finite temperature phase diagram without running large-scale statistical Monte-Carlo simulations, the superlattice was relaxed at its hypothetic centro-symmetric phase applying Pmna symmetry constrain, again matching silicon in xz-plane. Linear-response calculations of lattice dynamics of the hypothetic Pmna superlattice, which is believed to simulate the high-temperature non-polar phase of the silicon-matched system, reveal a high propensity of the superlattice to build a spontaneous polarization. This trend holds also in the less-restrictive case of stress-free relaxation, i.e., without silicon-imposed matching condition. Out of four unstable zone-center optical modes, two of them involve the staggered $B_{1u}$, and $B_{2u}$ infrared-active oscillations of oxygen anions, polarized along z and y axes, respectively. The $B_{3u}$ ferrodistortive mode has a potential to cause a transition to a ferroelectric phase with macroscopic polarization along the x-axis, i.e., in the epitaxial plane of SiO(14) superlattice. Only $A_u$ mode is featuring the anti-ferrodistortive rotations of the dyloxy dimers, which may lead to a state with vanishing macroscopic polarization and microscopic anti-ferroelectric ordering in the epitaxial plane.

Figure 18:
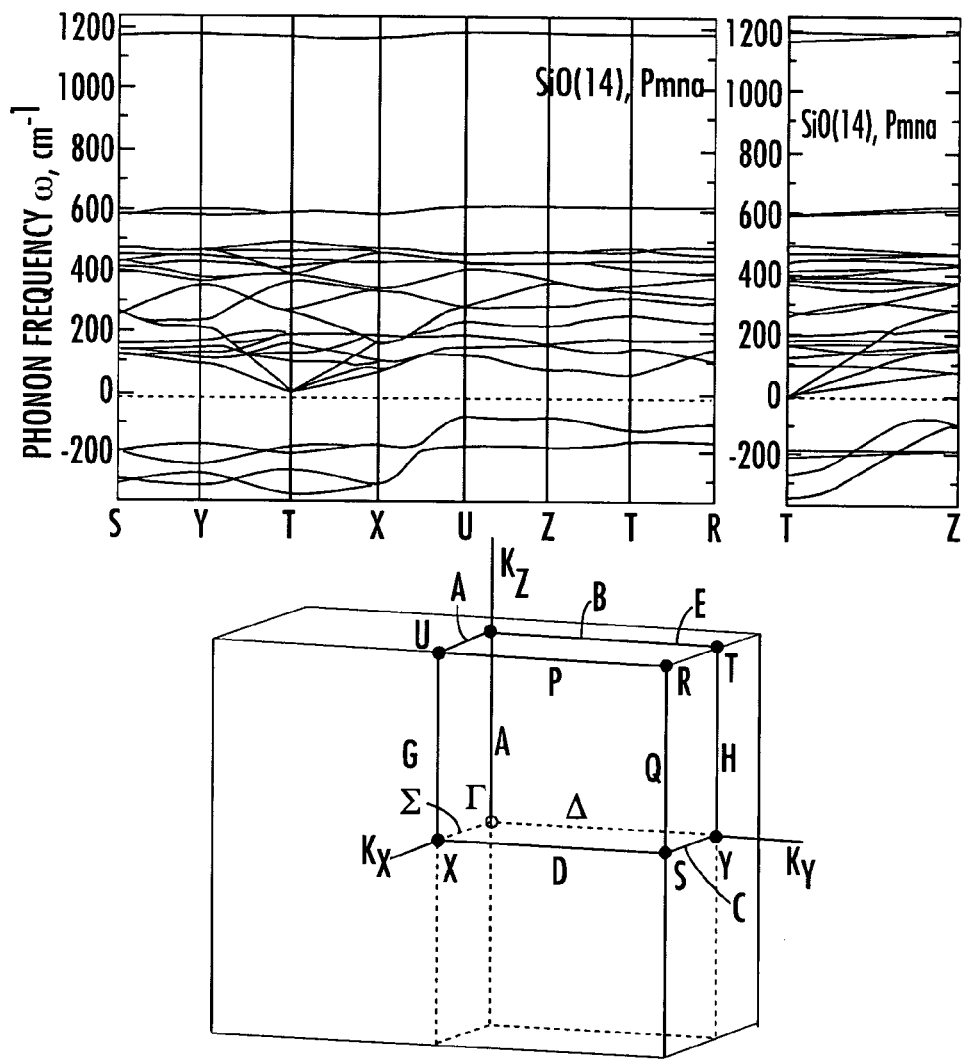
FIG. 18 is a graph and associated 3D representation of phonon dispersion in an SiO(14), Pmna symmetry, silicon-oxygen superlattice in accordance with the invention.
Figure 19:
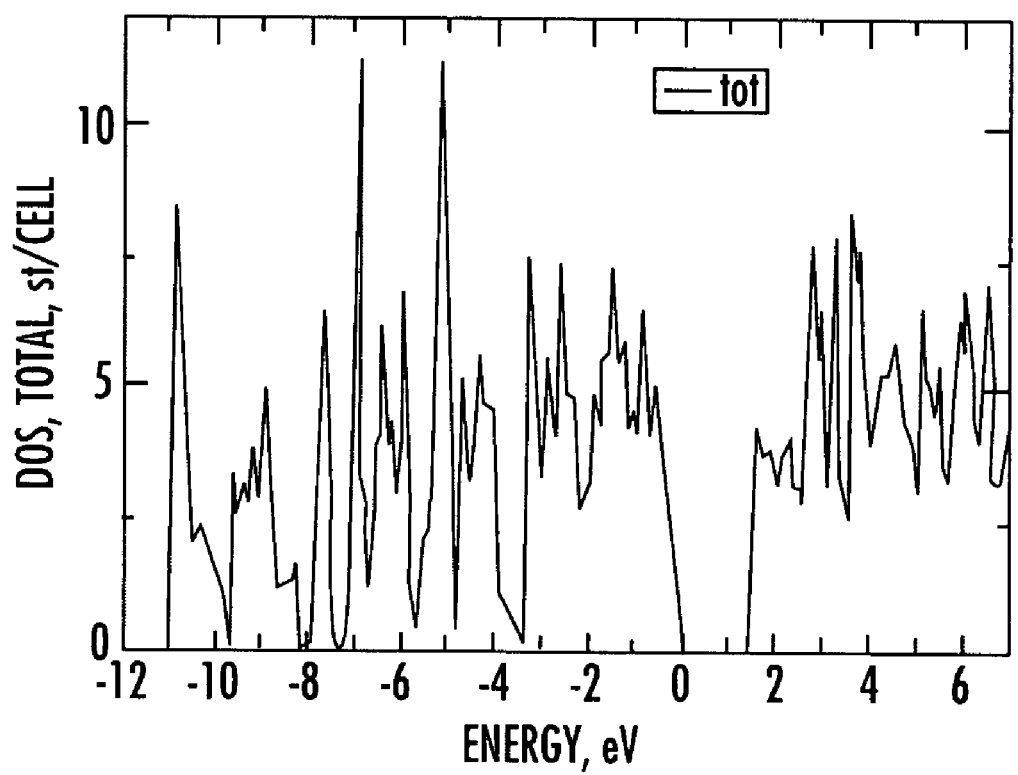
FIG. 19 is a graph of total density of states in a $Pnm2_1$ SiO(14) superlattice.

To reveal the spatial character of the unstable displacement-displacement correlations, it is instructive to analyze the reciprocal space dispersion of the phonons in the entire Brillouin zone, depicted in FIG. 18. Strong long-range correlations of the most unstable ferroelectric displacements within epitaxial plane, which irreps are $B_{1u}$ and $B_{2u}$ in the zone center, are emphasized by a high dispersion of the corresponding modes, opposing the local character of the anti-ferrodistortive displacements (third lowest in energy), according to the flatness of the respective phonon branch. Because of its short-range correlations, the $A_u$ AF displacements are most likely suppressed in the real system due to the presence of defects and impurities, which mitigate the dimers from rotations to develop antiferroelectric configurations. On account of similar arguments, the ferroelectric distortions of $B_{3u}$ symmetry, imposing a macroscopic polarization along the normal to the staggering plane, are also expected to have a low large-scale coherency, especially at elevated temperatures.

The symmetry breakdown of the high-symmetry phase free energy can be proceeded in terms of the displacement patterns of the unstable modes. Considered as a vector order parameter, the eigenvectors determine the set of space groups, which have to be subgroups of Pmn2$_1$ and can be assigned to the possible low-temperature phases of the superlattice. The space group symmetries and the expected polarization configurations of the superlattice phases developing as a result of the four unstable phonon modes, are listed in the following table in the order of their internal energy (zero-temperature free energy). Space group (SG) symmetry breakdown of Pmna, according to the displacement patterns of the unstable modes, is placed in the order of the corresponding total energies. AFM stands for the antiferrodistortive mode condensation. Epitaxial plane lattice parameters a=c=14.462948 Bohr are silicon matched, stacking parameter b is relaxed.

TABLE 3

| SG | Total energy, eV/cell | b/b$_{Si}$ Bohr | Polarization state |
|---|---|---|---|
| Pmna (N 53) | 0.00000 | 1.04516 | centra-symmetric |
| Pnc2 (N 30) | −0.22402 | 1.03641 | P ∥ x |
| P222$_1$ (N 17) | −0.28361 | 1.03532 | AFM |
| Pma2 (N 28) | −1.2449 | 1.00863 | P ∥ y |
| Pmn2$_1$ (N 31) | −1.3501 | 1.00177 | P ∥ z |

It is worth noting that the two lowest in energy lattice configurations are Pmn2$_1$ and Pma2, both implying spontaneous polarization either in the epitaxial plane or out of the plane, respectively, are highly degenerated, with the energy separation of just 10 meV per unit cell. This quasi-degeneracy, however, does not express the dynamics of the orientational transition between the two differently polarized phases. From the profile of the energy map for the 3-dimensional rotation of a single Si—O—Si buckled dimer, a substantial potential barrier of about 50 meV per dimer was inferred for the magnitude of z-y orientational anisotropy of the local dipole moment, which is also required to reorient the macroscopic P. In addition to the local effect of the potential barrier, there are also long-range effects of phonon-strain coupling, which is manifested as the contribution of various ferroelectric configurations with non-zero modulation vector.

The details of static piezo- and ferroelectric simulations for Si—O superlattices will be discussed further below. From a theoretical-group point of view, the high coverage of oxygen in silicon, epitaxially grown on silicon, leads to a development of the predominantly staggered distortion of the dyloxy dimers forming local dipoles, whereas building of the macroscopic polarization in the epitaxial plane causes a substantial strain of almost 5% in stacking direction and hence thermodynamically is more favorable at elevated temperatures.

The nature of bonding and electronic structure of the Pmn21 SiO(14) superlattice will now be further described. The electronic structure of silicon enriched epitaxially with oxygen preserves most of the features of pure silicon manifested in optics as long as the concentration of oxygen is low enough to bind only one of silicon sp$^3$-orbitals. The formation mechanism of Si—O—Si dimers can roughly be described already in terms of symmetry reduction from cubic centrosymmetric symmorphic Fd$\bar{3}$ m space group of silicon to orthorhombic non-centric non-symmorphic Pmn2$_1$ group of SiO(14) superlattice.

According to the 1s core level shifts on silicon sites adjacent to oxygens, the electrostatic field caused by charge transfer between Si and oxygen is strong enough to push down the electronic states on charge-depleted silicon sites, i.e., with an enhanced screening of the nucleus, by about 0.6 eV. The screening effect is large enough to shift the position of the charge-depleted Si 3d-states below the Fermi level, with effective occupation of 0.1 e per Si. Biased by the charge-transfer effects in the presence of electro-negative oxygen ions, the charge density distribution is featured by highly a laminated structure, with the largest component of the delocalization tensor ($r_\alpha r_\beta$) along the spontaneous polarization vector (11z).

The direct energy gap in the SiO(14) superlattice is larger than in pure Si by 30% and is expected to be around 1.5 eV, as modestly extrapolated from its LDA value of 1.0 eV, which typically underestimates the magnitude of the insulating gap by up to 50%. This substantial increase of the distance between valence and conduction states is due to the fact that silicon-centered sp3-orbitals are now depleted with electrons in the presence of more electronegative oxygens and therefore are more contracted in view of the reduced Coulomb screening of the silicon nuclei. The orbital contraction leads to an increased potential barrier between bonding and antibonding orbitals and thus results in the larger energy gap in the electron spectrum. As is well known, by complete saturation of silicon bonds with oxygens, i.e., in the case of $SiO_2$ chemical composition, the size of the energy gap amounts to about 6 eV, which is obviously related to the bonding-antibonding splitting in the spectrum of oxygen-centered 2p-orbitals, which as being nodeless have essentially higher spatial contraction compared to the node-containing silicon-centered 3p-orbitals.

It is quite instructive to focus on the second-order mechanisms, which stabilize a Sio film constrained by silicon substrate. According to the partial occupation numbers for angular momentum-projected states, the presence of oxygen on a silicon host causes substantial onsite hybridization of silicon sp3-orbitals with its 3d-orbitals and subsequent building of molecular dp-H-bonds between oxygen and silicons. This is a result of electrostatic potential caused by the depletion on the silicon sites bounded by oxygen, which is pulling all states uniformly down. On the Si(3) sites apart from oxygens, the d-states are practically not occupied, like in pure silicon, From angular-distribution point of view, the molecular dp-II-bonds between oxygen and silicons are contributed mostly due to the overlap between $p_z$ orbitals of oxygen and the $dx^2-y^2$, $d_{xy}$ orbitals of Si(2) and Si(1), respectively.

As a result of this binding, the associated crystal field effect and charge transfer between Si and O serves as a driving mechanism for an intrinsic trend of a singular dimer to reduce the Si—O—Si angle and shorten the Si—O bond length, as discussed further above. Thus, the local dipole momentum of an isolated dimer tends to maximize itself by increasing the effective charges of the dimer anion and cations, concomitantly decreasing the Si—O—Si angle. This intrinsic trend to develop a molecular dipole moment can particularly be used by controlling the SiO film or superlattice growth in the presence of an external electric field.

First-principle calculations of piezoelectric response in $(SiO)_m/Si_n$ superlattices with respect to polarization reversal will now be discussed. Three kinds of perturbations applied to an insulating crystal such as atomic displacements, homogenous strains, and homogenous electric field determine the following response functions: force constant matrix; dielectric susceptibility; elastic constants; Born effective charges; and piezoelectric tensor. There are two methods of a nearly same efficiency and accuracy to calculate the response functions from first principles, one based on the geometric Berry's phase approach (see M. V. Berry, Proc. R. Soc. London Ser. A 392, 45 (1984), and R. D. King-Smith et al., Phys. Rev. B 47, 1651 (1993)), and the other using the perturbation theory of linear response facilitated with conjugate-gradient algorithm (see X Gonze, Phys. Rev. B 55, 10337 (1997)). Pmn21 SiO (14), electronic dielectric tensor $\epsilon_{ij}^\infty$ (clamped ions) and relaxed ion dielectric tensor $\epsilon_{ij}^{tot}$, Cartesian notations are provided in Table 4.

TABLE 4

| | $\epsilon_{ij}^\infty$ | | | | $\epsilon_{ij}^{tot}$ | | |
|---|---|---|---|---|---|---|---|
| | 1 | 2 | 3 | | 1 | 2 | 3 |
| 1 | 13.77 | −0.00 | 0.00 | 1 | 15.33 | −0.00 | −0.00 |
| 2 | −0.00 | 11.10 | −0.00 | 2 | −0.00 | 13.65 | −0.00 |
| 3 | 0.00 | −0.00 | 10.62 | 3 | −0.00 | −0.00 | 13.94 |

Thus zone-center phonons or periodicity-preserving atomic displacements, homogenous electric fields, and homogenous strains as a different kind of perturbative degrees of freedom are being systematically treated within the same framework in order to reveal the strength of coupling between them and demonstrate the relevance of the above-described superlattice materials for pyroelectric, piezoelectric, ferroelectric, and dielectric applications. More specifically, we consider these three kinds of perturbations applied to the insulating $(SiO)_n/Si_m$ superlattice, which are point displacements $\delta R$ from their equilibrium positions at R, and homogeneous strain determined as a symmetric deformation tensor of the second rank $$\eta_{\alpha\beta} \equiv \frac{1}{2}\left(\frac{\partial R_\alpha}{\partial R_\beta} + \frac{\partial R_\beta}{\partial R_\alpha}\right), \quad (1.1)$$

which describes the change of length of a linear element dl on a body upon a deformation, i.e., $$|dl|_{deformed}^2 - |dl|_{undeformed}^2 = 2dl\hat{\eta}dl^T. \quad (1.2)$$

By virtue of its symmetric property the strain tensor is completely defined in general by only six variables, namely.

$$\eta_1 = \eta_{11}, \eta_2 = \eta_{22}, \eta_3 = \eta_{33}, \eta_4 = \eta_{23} + \eta_{32}, \eta_5 = \eta_{31} + \eta_{13}, \eta_6 = \eta_{12} + \eta_{21},$$

a notation due to Voigt (homogeneous electric fields E). All these perturbations can be considered as components of a combined vector. The following Table 5 provides the Pmn2$_1$ SiO(14), elastic tensor $c_{ij}$ [$10^2$GP] at relaxed ions, Voigt notations.

TABLE 5

| | $c_{ij}$ | | | | | |
|---|---|---|---|---|---|---|
| | 1 | 2 | 3 | 4 | 5 | 6 |
| 1 | 1.67 | 0.58 | 0.39 | 0.00 | 0.00 | 0.00 |
| 2 | 0.58 | 1.37 | 0.71 | 0.00 | 0.00 | 0.00 |
| 3 | 0.39 | 0.71 | 0.84 | 0.00 | 0.00 | 0.00 |
| 4 | 0.00 | 0.00 | 0.00 | 0.65 | 0.00 | 0.00 |
| 5 | 0.00 | 0.00 | 0.00 | 0.00 | 0.32 | 0.00 |
| 6 | 0.00 | 0.00 | 0.00 | 0.00 | 0.00 | 0.62 |

$x \equiv (\delta R, \eta_i, E$ so that the enthalpy $$\varepsilon(x) = \frac{1}{\Omega_0}[\varepsilon_0 - \Omega EP]$$

per undeformed unit cell volume $Q_0$, where So is the usual zero-field Kohn-Sham energy cell and Q is the perturbed cell volume, which can be written as an expansion $$\varepsilon(x) = \varepsilon_0 + Ax^T + \frac{1}{2}x\hat{B}x^T. \tag{1.4}$$

Pmn2$_1$ SiO(14), compliance tensor $c_{ij}$ [$10^{-2}$GP$^{-1}$] at relaxed ions, Voigt notations are provided in Table 6.

TABLE 6

| | | | $s_{ij}$ | | | |
|---|---|---|---|---|---|---|
| | 1 | 2 | 3 | 4 | 5 | 6 |
| 1 | 0.70 | −0.22 | −0.14 | 0.00 | 0.00 | 0.00 |
| 2 | −0.22 | 1.36 | −1.04 | 0.00 | 0.00 | 0.00 |
| 3 | −0.14 | −1.04 | 2.13 | −0.00 | 0.00 | 0.00 |
| 4 | 0.00 | 0.00 | −0.00 | 1.52 | 0.00 | 0.00 |
| 5 | 0.00 | 0.00 | 0.00 | 0.00 | 3.05 | 0.00 |
| 6 | 0.00 | 0.00 | 0.00 | 0.00 | 0.00 | 1.58 |

Other notations are as following:

$$A \equiv (-F/\Omega_0, \sigma_{i1}, -P) \tag{1.5}$$

is short for the first-order derivatives conjugate to these perturbations such as: force F exerted on a body volume element Dv at a point R; stress tensor $\sigma_{\alpha\beta}$; and $$f \equiv n\hat{\sigma}, \tag{1.6}$$

which describes the vector of force exerted on a unit of surface enclosing the body element dV, with n a normal to the surface. Similar to strain, $\hat{\sigma}$ is defined in general by only six components $\sigma_i$, i=(1 . . . 6), in Voigt notation.

Electric polarization $P=-\partial\varepsilon/\partial E$. Second-order derivatives are collected in a single matrix $\hat{B} \equiv (\hat{C}/\Omega_0, \hat{c}, \hat{\in}-1, -\hat{\Lambda}/\Omega_0, -\hat{Z}/\Omega_0, -\hat{e})$. Those are the linear response quantities, such as force-constant matrix C2$_j$, which determine the lattice vibrational modes; elastic-constant 6×6 matrix $c_{ij} \equiv \partial^2\varepsilon/\partial\eta_i\partial\eta_j|E=0$, $\delta R=0$ (frozen-ion); dielectric susceptibility matrix $\hat{\in}-1 \equiv \partial P/\partial E|\delta R=0$, $\hat{\eta}=0$ (frozen-ion); "Internal-strain" tensor $-\Lambda_{\alpha j} \equiv \partial^2\varepsilon/\partial\delta R_\alpha\partial\eta_j$; Born dynamical charge tensor Zaa,$_3$, resolved currently at the level of a single ion; and piezoelectric tensor of the third rank (frozen-ion) $e_{\alpha\beta\gamma} \equiv -\partial^2\varepsilon/\partial\eta_{\alpha\beta}\partial E_\gamma|\delta R=0$, which is commonly written as a 6×3 matrix $e_{i\gamma} \equiv -\partial^2\varepsilon/\partial\eta_i\partial E_\gamma$, using Voigt notation. Pmn2$_1$ SiO (14), proper piezoelectric tensor $e_{ij}$ [C/m$^2$] with relaxed ions, Voigt notations are provided in Table 7.

TABLE 7

| $d_{ij}$ | 1 | 2 | 3 |
|---|---|---|---|
| 1 | 0.00 | −0.00 | 0.07 |
| 2 | −0.00 | −0.00 | 0.15 |
| 3 | −0.00 | −0.00 | 1.72 |
| 4 | 0.00 | 0.16 | −0.00 |
| 5 | −0.04 | −0.00 | 0.00 |
| 6 | −0.00 | 0.00 | 0.00 |

So far, it has been tacitly assumed that the derivatives are taken at the clamped ions. More physical relaxed-ion quantities can be derived by first minimizing the enthalpy E($\delta R$, $\hat{\eta}$, E) in terms of ionic displacements $\delta R$ at a given strain and electric field, and then performing second derivatives listed above. The second-order quantities will then acquire additional terms expressed through the Born charge tensor, force-constant matrix and "internal strain" matrix. Numerical results for the relaxed-ion response tensors including elastic compliance tensor $\hat{S} \equiv \hat{c}^{-1}$ of a polarized Pmn2$_1$ SiO(14) superlattice are listed in Tables 4-8. The related "piezoelectric strain constant" $d_{\alpha j}$, used in practical applications more often than $\hat{e}$, is determined under conditions of controlled field and stress, E and $\sigma$, instead of field and strain for $\hat{e}$ and is defined as $$d_{\alpha j} \equiv \frac{\partial\eta_j}{\partial E_\alpha}\bigg|_{\sigma=0} = \frac{\partial P_\alpha}{\partial\sigma_j}\bigg|_{E=0}, \tag{1.7}$$

which is proportional to the piezoelectric tensor e scaled by the compliance tensor, i.e. $d_{\alpha j}=s_{jk}e_{\alpha k}$, j=(1 . . . 6).

For example, $d_{32}=-16.14$ [pC/N], $d_{33}=35.15$ [p/N], being of the same order of magnitude as the piezoelectric strain constant of perovskite piezoelectric materials. Such a high piezoelectric response is certainly reflecting the fact that large Born dynamic charges, which is as high as −4.9e for oxygens along the polarization, are coupled with the softness of the Si—O—Si dipole unit against the angular deformations causing the change of the dipole polarization both in magnitude and orientation. Pmn2$_1$ SiO(14), effective Born charges $Z_{i,\alpha\beta}^-$ [C] are set forth in Table 8, below.

TABLE 8

| atom | $\alpha\backslash\beta$ | x | y | z |
|---|---|---|---|---|
| O | x | −1.25 | 3.77E−08 | 1.31E−07 |
| | y | 1.08E−07 | −3.70 | −9.56E−01 |
| | z | 1.09E−07 | −1.36 | −4.89 |
| Si(1) | x | 1.37 | 7.01E−09 | 2.32E−09 |
| | y | −2.08E−08 | 1.75 | 5.18E−01 |
| | z | 7.37E−08 | 9.53E−02 | 7.66E−01 |
| Si(2) | x | 1.18 | 1.03E−07 | 1.49E−07 |
| | y | 9.14E−08 | 2.09 | 5.14E−02 |
| | z | 1.03E−08 | −1.83E−01 | 3.26 |
| Si(3) | x | −6.51E−01 | −1.22E−01 | 3.40E−01 |
| | y | 9.15E−03 | −7.02E−02 | 1.07E−01 |
| | z | −2.45E−01 | −1.27E−01 | 4.31E−01 |

In general, the piezoelectric strain constant $\hat{d}$ elastic compliance tensor $\hat{s}_E$ at zero field, and dielectric constant $\hat{\in}_\sigma$ at zero stress determine the induced strain $\eta$ and electric displacement $D=\in_\eta E+P$, where $\in_0$ is the dielectric constant of free space, in the piezoelectric material through the following equations:

$$\hat{\eta}=\hat{d}E+\hat{s}_E\hat{\sigma}, \text{ and} \tag{1.8}$$

$$D=\hat{d}\hat{\sigma}+\hat{\in}_\sigma E \tag{1.9}$$

Piezoelectric voltage constant g describing the electric field induced by external stress is defined as:

$$g_{\alpha j} \equiv \frac{\partial E_\alpha}{\partial\sigma_j} = \frac{1}{\varepsilon_0}(\hat{\in}-1)^{-1}_{\alpha\beta}d_{\beta j}, \tag{1.10}$$

and is another figure of merit important for sensor and transformer applications. For the field induced along the spontaneous polarization in the SiO(14) superlattice by the stress applied along the same direction, the voltage constant $g33=27010^{-3}$ [Vm/N] is larger than in PZT material by an order of magnitude.

Closely related dimensionless piezoelectric coupling coefficient k, which in high-symmetry systems is defined as $k_{\alpha j}=|d_{\alpha j}|/\sqrt{\in_{\alpha\alpha}s_{jj}}$, shows the efficiency of the coupling in an electromechanical transducer between the specified electric and elastic channels, with its theoretical limit at 1. In other words, electromechanical coupling factor k describes the conversion rate between applied electrical energy and stored mechanical energy, i.e., k2≡(Stored mechanical energy)/(Input electrical energy)=(Stored electrical energy)/(Input mechanical energy).

In an SiO(14) superlattice, considering especially the low symmetry of the system, it is more consistent to define a tensorial coupling quantity $$\tilde{k} = \hat{\varepsilon}^{-1/2} \hat{d} \hat{c}^{-1/2}, \quad (1.11)$$

which would reflect the anisotropy of the structure. The magnitude of the electromechanical coupling constant $k_{33}$=0.91 for the longitudinal length extension mode of the SiO(14) superlattice exceeds similar numbers for perovskite piezoelectric materials, simply because of the reduced screening of the electric field due to much lower dielectric constant of the superlattice. It should be noted that for the foregoing discussion, the fields and strains are considered as infinitesimally small in order to validate the linear response approach based on the perturbation method.

Additional features of the invention may be found in co-pending applications entitled ELECTRONIC DEVICE INCLUDING A POLED SUPERLATTICE HAVING A NET ELECTRICAL DIPOLE MOMENT, Ser. No. 11/614,477; ELECTRONIC DEVICE INCLUDING A SELECTIVELY POLABLE SUPERLATTICE, Ser. No. 11/614,535; and METHOD FOR MAKING AN ELECTRONIC DEVICE INCLUDING A SELECTIVELY POLABLE SUPERLATTICE, Ser. No. 11/614,559, the entire disclosures of which are hereby incorporated herein by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making an electronic device comprising:
   forming a poled superlattice comprising a plurality of stacked groups of layers and having a net electrical dipole moment;
   each group of layers of the poled superlattice comprising a plurality of stacked semiconductor monolayers defining a base semiconductor portion and at least one non-semiconductor monolayer thereon;
   the at least one non-semiconductor monolayer being constrained within a crystal lattice of adjacent base semiconductor portions, and at least some semiconductor atoms from opposing base semiconductor portions being chemically bound together through the at least one non-semiconductor monolayer therebetween; and
   coupling at least one electrode to the poled superlattice.

2. The method of claim 1 wherein the poled superlattice generates an electrical potential on the at least one electrode based upon a mechanical stress imparted on the poled superlattice.

3. The method of claim 2 further comprising positioning at least one mass adjacent the poled superlattice to impart the mechanical stress thereto based upon movement of the at least one mass.

4. The method of claim 1 wherein the poled superlattice generates an electrical potential on the at least one electrode based upon thermal energy imparted to the poled superlattice.

5. The method of claim 1 further comprising providing a thermal source for causing the poled superlattice to generate an electrical potential on the at least one electrode based upon thermal energy from the thermal source.

6. The method of claim 5 wherein the thermal source comprises a cathode.

7. The method of claim 6 further comprising positioning at least one anode adjacent the cathode.

8. The method of claim 5 further comprising positioning a semiconductor lens adjacent the poled superlattice on a side thereof opposite the cathode.

9. The method of claim 1 wherein the at least one electrode comprises an input electrode coupled to the poled superlattice for inducing a surface acoustic wave thereon, and an output electrode coupled to the poled superlattice and spaced apart from the first electrode.

10. The method of claim 9 wherein the input and output electrodes comprise interdigitated electrodes.

11. The method of claim 1 wherein the at least one electrode comprises a low voltage electrode and a high voltage electrode coupled to the poled superlattice; and wherein the poled superlattice transforms voltage levels between the low and high voltages.

12. The method of claim 1 wherein the poled superlattice is mechanically deformable based upon an electrical potential on the at least one electrode.

13. The method of claim 12 further comprising forming a backing layer and a matching layer on respective opposing sides of the poled superlattice so that the poled superlattice generates an acoustic signal based upon an electrical potential on the at least one electrode.

14. The method of claim 1 wherein the poled superlattice generates thermal energy based upon an electrical potential on the at least one electrode.

15. The method of claim 1 wherein forming the poled superlattice comprises exposing the superlattice to an electrical field to impart the net electrical dipole moment therein.

16. The method of claim 1 wherein each base semiconductor portion comprises silicon.

17. The method of claim 1 wherein each base semiconductor portion comprises a base semiconductor selected from the group consisting of Group IV semiconductors, Group III-V semiconductors, and Group II-VI semiconductors.

18. The method of claim 1 wherein each non-semiconductor monolayer comprises oxygen.

19. The method of claim 1 wherein each non-semiconductor monolayer comprises a non-semiconductor selected from the group consisting of oxygen, nitrogen, fluorine, and carbon-oxygen.

20. A method for making an electronic device comprising:
   forming a poled superlattice comprising a plurality of stacked groups of layers and having a net electrical dipole moment;
   each group of layers of the poled superlattice comprising a plurality of stacked silicon monolayers defining a base silicon portion and at least one oxygen monolayer thereon;
   the at least one oxygen monolayer being constrained within a crystal lattice of adjacent base semiconductor portions, and at least some silicon atoms from opposing base semiconductor portions being chemically bound together through the at least one oxygen monolayer therebetween; and
   coupling at least one electrode to the poled superlattice.

21. The method of claim 20 wherein the poled superlattice generates an electrical potential on the at least one electrode based upon a mechanical stress imparted on the poled superlattice.

22. The method of claim 20 wherein the poled superlattice generates an electrical potential on the at least one electrode based upon thermal energy imparted to the poled superlattice.

23. The method of claim 20 further comprising providing a thermal source for causing the poled superlattice to generate an electrical potential on the at least one electrode based upon thermal energy from the thermal source.

24. The method of claim 20 wherein the at least one electrode comprises an input electrode coupled to the poled superlattice for inducing a surface acoustic wave thereon, and an output electrode coupled to the poled superlattice and spaced apart from the first electrode.

25. The method of claim 20 wherein the at least one electrode comprises a low voltage electrode and a high voltage electrode coupled to the poled superlattice; and wherein the poled superlattice transforms voltage levels between the low and high voltages.

26. The method of claim 20 wherein the poled superlattice is mechanically deformable based upon an electrical potential on the at least one electrode.

27. The method of claim 20 wherein the poled superlattice generates thermal energy based upon an electrical potential on the at least one electrode.

* * * * *